United States Patent
Takashima et al.

(10) Patent No.: US 6,824,953 B2
(45) Date of Patent: Nov. 30, 2004

(54) PHOTOPOLYMERIZABLE COMPOSITION AND RECORDING MATERIAL

(75) Inventors: Masanobu Takashima, Shizuoka-ken (JP); Yuuichi Fukushige, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 132 days.

(21) Appl. No.: 10/060,153

(22) Filed: Feb. 1, 2002

(65) Prior Publication Data

US 2002/0182530 A1 Dec. 5, 2002

(30) Foreign Application Priority Data

Feb. 1, 2001 (JP) ........................................ 2001-025581

(51) Int. Cl.[7] .............................................. G03F 7/031
(52) U.S. Cl. ............................ 430/270.1; 430/270.18; 430/270.2; 430/138; 428/64.2
(58) Field of Search ......................... 430/270.1, 270.18, 430/270.2, 138; 428/64.2

(56) References Cited

U.S. PATENT DOCUMENTS

| | | | |
|---|---|---|---|
| 4,168,981 A | * 9/1979 | Donald et al. | 430/288.1 |
| 4,307,182 A | 12/1981 | Dalzell et al. | |
| 4,311,786 A | * 1/1982 | Steiger et al. | 430/411 |
| 4,772,541 A | 9/1988 | Gottschalk et al. | |
| 4,800,148 A | * 1/1989 | Harada et al. | 430/138 |
| 4,952,480 A | 8/1990 | Yamaguchi et al. | |
| 6,002,664 A | 12/1999 | Schachter | |
| 6,011,180 A | 1/2000 | Cunningham et al. | |

| | | | |
|---|---|---|---|
| 2002/0168494 A1 | * 11/2002 | Nagata et al. | 428/64.2 |
| 2002/0177074 A1 | * 11/2002 | Hoshi et al. | 430/281.1 |
| 2003/0059705 A1 | * 3/2003 | Matsumoto et al. | 430/138 |

FOREIGN PATENT DOCUMENTS

EP 0 412 570 B1 10/1996

* cited by examiner

Primary Examiner—Yvette C. Thornton
(74) Attorney, Agent, or Firm—Sughrue Mion, PLLC

(57) ABSTRACT

Disclosed are a photopolymerizable composition and a recording material containing the composition. The composition comprises a polymerizable compound having an ethylenic unsaturated bond, a compound of the following general formula (1), and a radical generator that interacts with the compound of formula (1) to generate a radical. In formula (1), each of $R^1$, $R^2$ and $R^4$ is an aliphatic or aromatic group; $R^3$ is a group shown below; $R^5$ is a hydrogen atom, or an aliphatic, aromatic or heterocyclic group; Each of $L^1$ to $L^4$ is a substituted or unsubstituted methine group; Each of $Z^1$ to $Z^3$ is an atomic group which forms a 5-membered nitrogen-containing hetero ring; and $X^-$ is a group which forms an anion

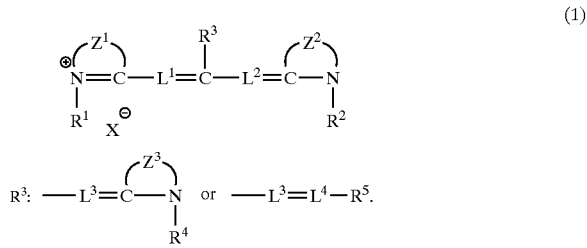

17 Claims, No Drawings

PHOTOPOLYMERIZABLE COMPOSITION AND RECORDING MATERIAL

BACKGROUND OF THE INVENTION

1. Field of the Invention

The present invention relates to a photopolymerizable composition and a recording material which are both novel. More specifically, the invention relates to such a photopolymerizable composition and a recording material favorable for use in, for example, inks, color filters, holograms, proofs, sealants, adhesives, lithographic prints, resin relief prints, and photoresists.

2. Description of the Related Art

A photopolymerizable composition basically comprises a photopolymerization initiator and an addition-polymerizable compound containing at least 2 ethylenic unsaturated bonds in one molecule (this is hereinafter referred to as a "polyfunctional monomer"). The photopolymerizable composition hardens, when exposed to light, and its cohesiveness changes and it thus becomes insoluble in solvents. In order to take advantage of these properties, the composition is widely utilized in, for example, photographs, prints, metal surface processing techniques and inks. The functions and the applications of such a photopolymerizable compositions are described in various publications.

They are described in detail, for example, in J. Kosar's *Light Sensitive Systems* (J. Wiley & Sons, New York, 1965, pp. 158–193); and K. I. Jacobson & R. E. Jacobson's *Imaging Systems* (J. Wiley & Sons, New York, 1976, pp. 181–222).

In recent years, an image formation system utilizing photosensitive microcapsule in which a photopolymerizable composition is contained has been proposed. For example, JP-A 57-124343, 57-179836 and 57-197538 disclose a method of forming color images, which comprises exposing a color-forming sheet (which is coated with microcapsules that contain a photopolymerizable composition comprising a vinyl compound and a photopolymerization initiator, and a dye) to light, then superposing an image-receiving sheet onto it, and applying pressure to thereby form a color image on the image-receiving sheet.

JP-A 3-87827 and 4-211252 disclose a photosensitive thermal recording material for color image formation thereon, which contains two components and in which one of the two components is encapsulated in microcapsules and the other is a curable compound of a photocurable composition. The second component may also be outside the microcapsules along with a photocurable composition. One example of the photosensitive thermal recording material disclosed in the latter has a layer that contains microcapsules of an electron-donating leuco-dye, and contains, outside the microcapsules, a photocurable composition that comprises an electron-receiving compound, a polymerizable vinyl monomer and a photopolymerization initiator.

As mentioned above, the recording material comprising a photopolymerizable composition can be processed for image formation thereon in a complete dry system not requiring developer and thus not producing waste, and is therefore very favorable in view of protection of the environment.

In image formation on such photosensitive recording materials, using not only UV rays and short-wave visible rays but also inexpensive IR lasers and blue to red rays, if possible, is desired. However, most recording materials that comprise a conventional photopolymerizable composition are sensitive to UV rays but not to rays in the visible to IR range, and even if they are sensitive also to rays in the visible to IR range, their sensitivity is insufficient. As a result, the images formed on them are often blurred, and the contrast between the image area and the non-image area therein is often low. Therefore, it is desired to further increase the sensitivity of conventional recording materials.

In general, spectral sensitizing dyes are used in these recording materials for enhancing the sensitivity of the materials to light to which they are exposed for image recording (writing) thereon. However, after images have been recorded on them through exposure to light, the materials are again exposed to light which the dyes therein can absorb and by which the dyes are photodecomposed so that their colors are completely erased from the image-recorded materials. Namely, the recording materials containing such spectral sensitizing dyes are required to have the ability to erase the colors of the dyes in order that sharp and high-contrast images can be formed on them.

SUMMARY OF THE INVENTION

The present invention is to solve the prior-art problems mentioned above, and to attain the objects mentioned below.

Specifically, one object of the invention is to provide a photopolymerizable composition highly sensitive to not only UV rays but also rays in the visible to IR range.

Another object of the invention is to provide a recording material which is capable of highly sensitive image recording using not only UV rays but also rays in the visible to IR range and which is processable in a completely-dry system which does not require developer and does not produce waste, and in which the colors in its non-image area (background area) can be erased and on which sharp and high-contrast black-and-white or color images can be formed.

The means of the invention for solving the problems mentioned above are as follows.

The invention provides a photopolymerizable composition that comprises a polymerizable compound having an ethylenic unsaturated bond, a compound of the following general formula (1), and a radical generator capable of interacting with the compound of formula (1) to generate a radical:

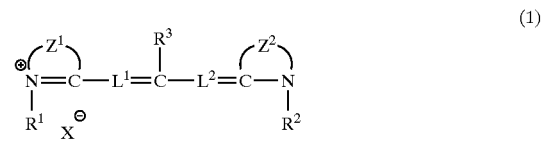
(1)

wherein $R^1$ and $R^2$ each independently represents an aliphatic group or an aromatic group; $R^3$ represents a group of the following formula:

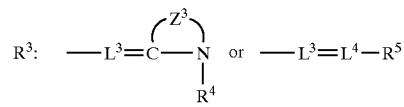

$R^4$ represents an aliphatic group or an aromatic group; $R^5$ represents a hydrogen atom, an aliphatic group, an aromatic group, or a heterocyclic group; $L^1$, $L^2$, $L^3$ and $L^4$ each independently represents a substituted or unsaturated methine group, and in the case where $L^1$, $L^2$, $L^3$ and $L^4$ each represents a methine group having a substituent, the substituents may be bonded to each other to form an unsaturated aliphatic ring or an unsaturated hetero ring; $Z^1$, $Z^2$ and $Z^3$ each independently represents an atomic group which forms a 5-membered nitrogen-containing hetero ring, and the nitrogen-containing hetero ring may be condensed with any of an aromatic ring or a hetero ring, and the nitrogen—containing hetero ring as well as the aromatic ring and the hetero ring, if condensed with the nitrogen-containing hetero ring, may be substituted or unsubstituted; and $X^-$ represents a group which forms an anion.

In one embodiment of the photopolymerizable composition of the invention, the compound of formula (1) is any one of a compound of the following general formula (2) and a compound of the following general formula (3):

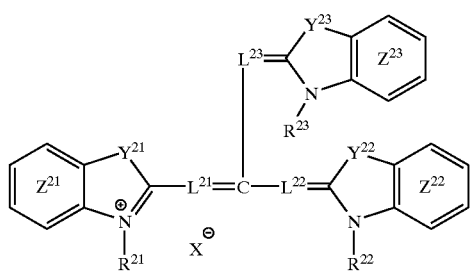
(2)

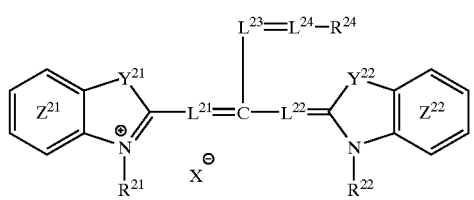
(3)

wherein $R^{21}$, $R^{22}$ and $R^{23}$ each independently represents an aliphatic group or an aromatic group; $R^{24}$ represents a hydrogen atom, an aliphatic group, an aromatic group or a heterocyclic group; $L^{21}$, $L^{22}$, $L^{23}$ and $L^{24}$ each independently represents a substituted or unsubstituted methine group; $Y^{21}$, $Y^{22}$ and $Y^{23}$ each independently represents —$CR^{25}R^{26}$—, —$NR^{27}$—, —O—, —S—, —Se— or —Te—; $R^{25}$, $R^{26}$ and $R^{27}$ each independently represents a hydrogen atom, an aliphatic group or an aromatic group; $R^{25}$ and $R^{26}$ may be atomic groups bonded to each other to form a ring; the benzene rings $Z^{21}$, $Z^{22}$ and $Z^{23}$ may be condensed with other benzene rings; the benzene rings $Z^{21}$, $Z^{22}$ and $Z^{23}$ as well as the other benzene rings, if any, which are condensed with the benzene rings $Z^{21}$, $Z^{22}$ and $Z^{23}$ maybe substituted or unsubstituted; and $X^-$ represents an anion.

In another embodiment of the invention, the photopolymerizable composition comprises a polymerizable compound having an ethylenic unsaturated bond, a compound of the following general formula (4), and a radical generator capable of interacting with the compound of formula (4) to generate a radical:

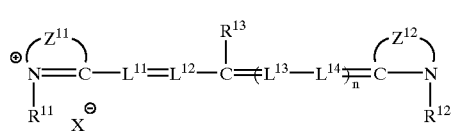
(4)

wherein $R^{11}$ and $R^{12}$ each independently represents an aliphatic group or an aromatic group; $R^{13}$ represents a group of the following formula:

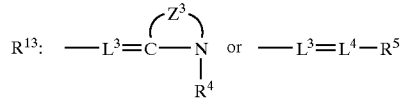

$R^4$ represents an aliphatic group or an aromatic group; $R^5$ represents a hydrogen atom, an aliphatic group, an aromatic group, or a heterocyclic group; $L^{11}$, $L^{12}$, $L^{13}$, $L^{14}$, $L^3$ and $L^4$ each independently represents an substituted or unsubstituted methine group, and in the case where $L^{11}$, $L^{12}$, $L^{13}$, $L^{14}$, $L^3$ and $L^4$ each represents a methine group having a subsituent, the substituent may be bonded to each other to form an unsaturated aliphatic ring or an unsaturated hetero ring; $Z^{11}$, $Z^{12}$ and $Z^3$ each independently represents an atomic group which forms a 5-membered nitrogen-containing hetero ring, the nitrogen-containing hetero ring may be condensed with any of an aromatic ring or a hetero ring, and the nitrogen-containing hetero ring as well as the aromatic ring and the hetero ring, if condensed with the nitrogen-containing hetero ring, may be substituted or unsubstituted; n indicates 0, 1 or 2; and $X^-$ represents a group which forms an anion.

In still another embodiment of the photopolymerizable composition of the invention, the compound of formula (4) is any one of a compound of the following general formula (5) and a compound of the following general formula (6):

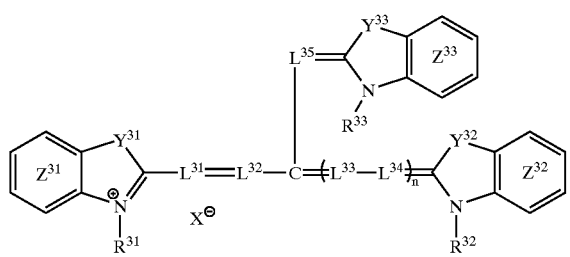
(5)

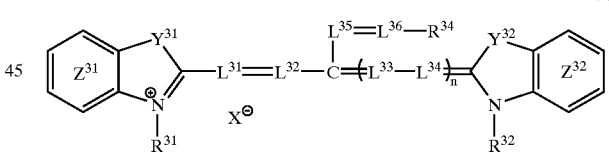
(6)

wherein $R^{31}$, $R^{32}$ and $R^{33}$ each independently represents an aliphatic group or an aromatic group; $R^{34}$ represents a hydrogen atom, an aliphatic group, an aromatic group or a heterocyclic group; $L^{31}$, $L^{32}$, $L^{33}$, $L^{34}$, $L^{35}$ and $L^{36}$ each independently represents an substituted or unsubstituted methine group; $Y^{31}$, $Y^{32}$ and $Y^{33}$ each independently represents —$CR^{35}R^{36}$—, —$NR^{37}$—, —O—, —S—, —Se— or —Te—; $R^{35}$, $R^{36}$ and $R^{37}$ each independently represents a hydrogen atom, an aliphatic group or an aromatic group; $R^{35}$ and $R^{36}$ may be atomic groups bonded to each other to form a ring; the benzene rings $Z^{31}$, $Z^{32}$ and $Z^{33}$ may be condensed with other benzene rings; the benzene rings $Z^{31}$, $Z^{32}$ and $Z^{33}$ as well as the other benzene rings, if any, which are condensed with the benzene rings $Z^{31}$, $Z^{32}$ and $Z^{33}$ may be substituted or unsubstituted; and $X^-$ represents an anion.

In still another embodiment of the photopolymerizable composition of the invention, the radical generator is an organoboron compound.

In still another embodiment of the photopolymerizable composition of the invention, the organoboron compound is represented by the following general formula (A):

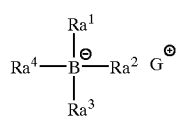
(A)

wherein $R_a^1$, $R_a^2$, $R_a^3$ and $R_a^4$ each independently represents an aliphatic group, an aromatic group, a heterocyclic group, or Si $(R_a^5)$ $(R_a^6)$ —$R_a^7$; $R_a^5$, $R_a^6$ and $R_a^7$ each independently represents an aliphatic group or an aromatic group; and $G^+$ represents a group to form a cation.

The invention also provides a recording material having a recording layer on a support, in which the recording layer contains at least a color-forming component A, a color-forming component B having a site that reacts with the color-forming component A to form a color, and the above-mentioned photopolymerizable composition.

In one embodiment of the recording material of the invention, at least one of the polymerizable compounds having an ethylenic unsaturated bond is the color-forming component B.

In still another embodiment of the recording material of the invention, the polymerizable compound having an ethylenic unsaturated bond is a color formation-inhibiting compound which additionally has, in one molecule, a site that inhibits the reaction of the color-forming components A and B.

In still another embodiment of the recording material of the invention, the color-forming component A is in microcapsules.

In still another embodiment of the recording material of the invention, the radical generator is an organoboron compound.

DETAILED DESCRIPTION OF THE PREFERRED EMBODIMENTS

The photopolymerizable composition of the invention includes two embodiments. In one embodiment thereof, the compound capable of interacting with the radical generator, or that is, the spectral sensitizing dye is a compound of formula (1) shown below; and in another embodiment thereof, it is a compound of formula (4) shown below. The recording material of the invention is characterized in that the recording layer on the support contains the photopolymerizable composition of the invention along with color-forming components.

The photopolymerizable composition of the invention is described in detail hereinunder, through which the details of the recording material of the invention are clarified.

Photopolymerizable Composition:

The photopolymerizable composition of the invention comprises a polymerizable compound having an ethylenic unsaturated bond, a compound of formula (1) or (4) mentioned below, and a radical generator capable of interacting with the compound of formula (1) or (4) to generate a radical, and optionally contains any other component.

Ethylenic Unsaturated Bond-Having, Polymerizable Compound:

The photopolymerizable composition of the invention contains a polymerizable compound having an ethylenic unsaturated bond (this will be hereinafter referred to as a "polymerizable compound").

The polymerizable compound has at least one ethylenic unsaturated double bond in one molecule. The compound for use herein is not particularly limited and may be selected from any compounds of the type in accordance with the object of the invention. For example, the compound includes acrylic acid derivatives such as acrylates and acrylamides; acrylic acid and its salts; methacrylic acid derivatives such as methacrylates and methacrylamides; methacrylic acid and its salts; and maleic anhydride, maleates, itaconic acid, itaconates, styrenes, vinyl ethers, vinyl esters, N-vinyl heterocyclic compounds, allyl ethers, allyl esters.

The polymerizable compound contains one or more olefinic double bonds, and may be any of low-molecular compounds (monomers) or high-molecular compounds (oligomers).

The double bond-containing monomers are, for example, alkyl or hydroxyalkyl acrylates or methacrylates such as methyl acrylate, ethyl acrylate, butyl acrylate, 2-ethylhexyl acrylate, 2-hydroxyethyl acrylate, isobornyl acrylate, methyl methacrylate and ethyl methacrylate. Also preferred for use herein is silicon acrylate.

Other examples of the monomers are acrylonitrile, acrylamide, methacrylamide, N-substituted (meth)acrylamides; vinyl esters such as vinyl acetate; vinyl ethers such as isobutyl vinyl ether; and styrene, alkyl- and halostyrenes, N-vinylpyrrolidone, vinyl chloride and vinylidene chloride.

Examples of the monomers having two or more double bonds in one molecule are ethylene glycol, propylene glycol, neopentyl glycol, hexamethylene glycol or bisphenol A diacrylates; and 4,4'-bis (2-acryloyloxyethoxy) diphenylpropane, trimethylolpropane triacrylate, pentaerythritol triacrylate or tetraacrylate; vinyl acrylate, divinylbenzene, divinyl succinate, diallyl phthalate, triallyl phosphate, triallyl isocyanurate, and tris(2-acryloylethyl) isocyanurate.

Examples of the polyunsaturated compounds having a relatively high molecular weight (oligomers) are epoxy resins having a (meth)acrylic group, polyesters having a (meth)acrylic group, and polyesters, polyurethanes and polyethers having a vinyl ether or epoxy group. Further examples of the unsaturated oligomers are unsaturated polyester resins, which are generally produced from maleic acid, phthalic acid and one or more diols and which have a molecular weight of approximately from 500 to 3000. In addition to these, also usable herein are vinyl ether monomers and oligomers, as well as maleate-terminated oligomers having a polyester, polyurethane, polyether, polyvinyl ether or epoxy main chain. Especially preferred for use herein are combinations of oligomers and polymers having a vinyl ether group described in WO90/01512. Also preferred are copolymers of vinyl ethers and maleic acid-functional monomers. The unsaturated oligomers of these types may be prepolymers.

Especially preferred examples are esters of ethylenic unsaturated carboxylic acids with polyols or polyepoxides; polymers having an ethylenic unsaturated group in the main chain or the side chains, such as unsaturated polyesters, polyamides and polyurethanes and their copolymers, alkyd resins, polybutadiene and butadiene copolymers, polyisoprene and isoprene copolymers; polymers and copolymers having a (meth)acrylic group in the side chains; and mixtures of more than one of such polymers.

Examples of the unsaturated carboxylic acids are unsaturated fatty acids such as acrylic acid, methacrylic acid, crotonic acid, itaconic acid, cinnamic acid, linolic acid and oleic acid. Of those, preferred are acrylic acid and methacrylic acid.

For the polyols, preferred are aromatic, especially aliphatic and cycloaliphatic polyols. Examples of the aromatic polyols are hydroquinone, 4,4'-dihydroxydiphenyl, 2,2-di(4-hydroxyphenyl)propane, novolak and resorcinol. Examples of the polyepoxides are those basically from the above-mentioned polyols, especially aromatic polyols, and epichlorohydrin. Other preferred examples of the polyols are polymers and copolymers having a hydroxyl group in the polymer chain or the side chains, for example, including polyvinyl alcohol and its copolymers, polyhydroxyalkyl methacrylates and their copolymers. Still other examples of preferred polyols are hydroxyl-terminated oligoesters.

Examples of the aliphatic and cycloaliphatic polyols are alkylene-diols preferably having from 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol; polyethylene glycol preferably having a molecular weight of from 200 to 1500, 1,3-cyclopentanediol, 1,2-, 1,3- or 1,4-cyclohexanediol, 1,4-dihydroxymethylcyclohexane, glycerol, tris (β-hydroxyethyl)amine, trimethylolethane, trimethylolpropane, pentaerythritol, dipentaerythritol, and sorbitol.

The polyols may be partially or wholly esterified with one or more different unsaturated carboxylic acids. In their partial esters, the free hydroxyl group may be modified, for example, it may be etherified or esterified with any other carboxylic acid.

The esters include, for example, the following: Trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylates and methacrylates, glycerol diacrylate and triacrylate, 1,4-cyclohexane diacrylate, bisacrylate and bismethacrylate of polyethylene glycol having a molecular weight of from 200 to 1500, and their mixtures.

For the polymerizable compound, also preferred are amides of one or more different unsaturated carboxylic acids with aromatic, cycloaliphatic or aliphatic polyamines preferably having from 2 to 6, more preferably from 2 to 4 amino groups.

Examples of the polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexanone, isophoronediamine, phenylenediamine, bisphenylenediamine, di-β-aminoethyl ether, diethylenetriamine, triethylenetetramine, di(β-aminoethoxy)- or di(β-aminopropoxy)ethane. Also preferred are polymers and copolymers having an amino group in the side chains, and amine-terminated oligoamides. Examples of the unsaturated amides are methylenebisacrylamide, 1,6-hexamethylenebisacrylamide, diethylenetriamine-trismethacrylamide, bis(methacrylamidopropoxy)ethane, β-methacrylamidoethyl methacrylate, and N-[(β-hydroxyethoxy)ethyl]acrylamide.

The unsaturated polyesters and polyamides that are preferred for use herein are derived from, for example, maleic acid and from diols or diamines. In these, some maleic acid units may be substituted with any other dicarboxylic acid units. These may be used along with ethylenic unsaturated comonomers such as styrene. The polyesters and polyamides are derived from dicarboxylic acids or from ethylenic unsaturated diols or diamines, especially from those having a relatively long chain, for example, having from 6 to 20 carbon atoms. Examples of the polyurethanes are those composed of saturated or unsaturated diisocyanates, and unsaturated or saturated diols.

Polybutadiene and polyisoprene and their copolymers are known. Examples of the preferable comonomers are olefins such as ethylene, propene, butene, hexene, (meth)acrylates, acrylonitrile, styrene and vinyl chloride. Also known are polymers having a (meth)acrylate group in the side chains. They may be obtained, for example, as reaction products of novolak-based epoxy resins with (meth)acrylic acid, or may be homo- or copolymers of vinyl alcohol or hydroxyalkyl derivatives esterified with (meth)acrylic acid, or may also be homo- or copolymers of (meth)acrylates esterified with hydroxyalkyl (meth)acrylates.

Depending on the use of the photopolymerizable composition, the polymerizable compound to be included in the composition may have in its structure, additional sites having other functions. For example, when the photopolymerizable composition is used in a recording material, the compound in the composition may have a site that promotes the reaction of the color-forming component in the material to form an image area therein, or may have a site that inhibits the reaction of the color-forming component. This will be described in detail hereinunder.

The amount of the polymerizable compound having an ethylenic unsaturated bond to be in the photopolymerizable composition may fall generally between 10 and 99% by weight, preferably between 30 and 95% by weight of the composition.

Compound of Formula (1):

The photopolymerizable composition of the invention contains, as a spectral sensitizing dye, a compound of the following general formula (1). The dye is a cyanine dye, which functions to spectrally sensitize the radical generator in the composition. Therefore, when the composition is exposed to light of rays in the visible to IR range corresponding to the optical absorption of the dye therein, the radical generator therein, even if it does not have an optical absorption within that range, can be activated to generate its radical in the composition. When exposed to light, the color of the dye is erased. Therefore, using the dye of the type in the photopolymerizable composition and in the recording material that contains the composition and will be described in detail hereinunder is advantageous, as increasing the sensitivity of the composition and also that of the recording material. Another advantage of using the dye in the recording material is that the background area of the material is prevented from being fogged and sharp and high-contrast images can be recorded on the material.

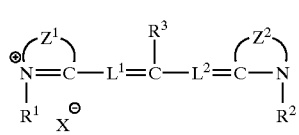

(1)

In formula (1), $R^1$ represents an aliphatic group or an aromatic group. Examples of the aliphatic group for $R^1$ includes an alkyl group, a substituted alkyl group, an alkenyl group, a substituted alkenyl group, an alkynyl group, a substituted alkynyl group, an aralkyl group, and a substituted aralkyl group. Especially preferred is an alkyl group, a substituted alkyl group, an alkenyl group, a substituted alkenyl group, an aralkyl group or a substituted aralkyl group, and more preferred is an alkyl group or a substituted alkyl group.

The aliphatic group may be a cyclic aliphatic group or a linear aliphatic group. The linear aliphatic group may be branched.

The alkyl group may be linear, branched or cyclic, preferably having from 1 to 30 carbon atoms, more preferably from 1 to 20 carbon atoms. The alkyl group may be substituted or unsubstituted. The preferred range of the number of carbon atoms constituting the alkyl moiety of the substituted alkyl group is the same as that for the unsubstituted alkyl group.

The alkyl group includes, for example, methyl, ethyl, propyl, butyl, pentyl, hexyl, octyl, 2-ethylhexyl, decyl, dodecyl, octadecyl, cyclohexyl, cyclopentyl, neopentyl, isopropyl and isobutyl groups.

The substituent of the substituted alkyl group includes, for example, a carboxyl group, a sulfo group, a cyano group, a halogen atom (e.g., fluorine, chlorine, bromine), a hydroxyl group, an alkoxycarbonyl group having at most 30 carbon atoms (e.g., methoxycarbonyl, ethoxycarbonyl, benzyloxycarbonyl), an alkylsulfonylaminocarbonyl group having at most 30 carbon atoms, an arylsulfonylaminocarbonyl group, an alkylsulfonyl group, an arylsulfonyl group, an acylaminosulfonyl group having at most 30 carbon atoms, an alkoxy group having at most 30 carbon atoms (e.g., methoxy, ethoxy, benzyloxy, phenoxyethoxy, phenethyloxy), an alkylthio group having at most 30 carbon atoms (e.g., methylthio, ethylthio, methylthioethylthioethyl), an aryloxy group having at most 30 carbon atoms (e.g., phenoxy, p-tolyloxy, 1-naphthoxy, 2-naphthoxy) a nitro group, an alkyl group having at most 30 carbon atoms, an alkoxycarbonyloxy group, an aryloxycarbonyloxy group, an acyloxy group having at most 30 carbon atoms (e.g., acetyloxy, propionyloxy), an acyl group having at most 30 carbon atoms (e.g., acetyl, propionyl, benzoyl), a carbamoyl group (e.g., carbamoyl, N,N-dimethylcarbamoyl, morpholinocarbonyl, piperidinocarbonyl), a sulfamoyl group (e.g., sulfamoyl, N,N-dimethylsulfamoyl, morpholinosulfonyl, piperidinosulfonyl), an aryl group having at most 30 carbon atoms (e.g., phenyl, 4-chlorophenyl, 4-methylphenyl, α-naphthyl), a substituted amino group (e.g., amino, alkylamino, dialkylamino, arylamino, diarylamino, acylamino), a substituted ureido group, a substituted phosphono group, and a heterocyclic group. Of those, the carboxyl group, the sulfo group, the hydroxyl group and the phosphono group may be in the form of salts. The cations to form the salts may be those of $G^+$ mentioned below.

The alkenyl group may be linear, branched or cyclic. Preferably, it has from 2 to 30 carbon atoms, more preferably from 2 to 20 carbon atoms. The alkenyl group may be substituted or unsubstituted. The preferred range of the number of carbon atoms constituting the alkenyl moiety in the substituted alkenyl group is the same as that mentioned above for the alkenyl group.

The substituents of the substituted alkenyl group may be the same as those mentioned above for the substituted alkyl group.

The alkynyl group may be linear, branched or cyclic. Preferably, it has from 2 to 30 carbon atoms, more preferably from 2 to 20 carbon atoms. The alkynyl group may be substituted or unsubstituted. The preferred range of the number of carbon atoms constituting the alkynyl moiety in the substituted alkynyl group is the same as that mentioned above for the alkynyl group.

The substituents of the substituted alkynyl group are the same as those mentioned above for the substituted alkyl group.

The aralkyl group may be linear, branched or cyclic. Preferably, it has from 7 to 35 carbon atoms, more preferably from 7 to 25 carbon atoms. The aralkyl group may be substituted or unsubstituted. The preferred range of the number of carbon atoms constituting the aralkyl moiety in the substituted aralkyl group is the same as that mentioned above for the aralkyl group.

The substituents of the substituted aralkyl group are the same as those mentioned above for the substituted alkyl group.

The aromatic group for $R^1$ includes, for example, an aryl group and a substituted aryl group. Preferably, the aryl group has from 6 to 30 carbon atoms, more preferably from 6 to 20 carbon atoms. The preferred range of the number of carbon atoms constituting the aryl moiety in the substituted aryl group is the same as that mentioned above for the aryl group. The aryl group includes, for example, phenyl, α-naphthyl and β-naphthyl groups.

The substituents of the substituted aryl group may be the same as those mentioned above for the substituted alkyl group.

In formula (1), $R^2$ represents an aliphatic group or an aromatic group. The aliphatic group and the aromatic group for $R^2$ is defined in the same way as the aliphatic group and the aromatic group for $R^1$. Particularly preferable, $R^1$ and $R^2$ are the same.

In formula (1), $L^1$ and $L^2$ each independently represents a substituted or unsubstituted methine group. The substituents of substituted methine groups for $L^1$ and $L^2$ may be bonded to each other to form an unsaturated aliphatic ring or an unsaturated hetero ring.

Examples of the substituents for the methine group are a substituted amino group (e.g., amino, alkylamino, dialkylamino, arylamino, diarylamino, acylamino), a substituted oxy group (e.g., hydroxy, alkoxy, acyloxy, aryloxy, alkoxycarbonyloxy, aryloxycarbonyloxy), a substituted mercapto (e.g., alkylmercapto, arylmercapto), a halogen atom, an aliphatic group, and an aromatic group.

Examples of the halogen atom includes fluorine, bromine and chlorine atoms. The aliphatic group and the aromatic group may be defined in the same way as the aliphatic group and the aromatic group for $R^1$ mentioned hereinabove. The substituents for the substituted amino group, the substituted oxy group and the substituted mercapto group are the same as the substituents for the substituted alkyl group for $R^1$ mentioned above.

The methine group for $L^1$ and $L^2$ is preferably an unsubstituted methine group, or a methine group substituted with a halogen atom or an aliphatic group. It is also preferable that the substituents of the substituted methine groups for these are bonded to each other to form a cyclopentene ring or a cyclohexene ring.

In formula (1), $Z^1$ and $Z^2$ each independently represents an atomic group which forms a 5-membered nitrogen-containing hetero ring, the nitrogen-containing hetero ring may be condensed with any of an aromatic ring or a hetero ring, and the nitrogen-containing hetero ring as well as the aromatic ring and the hetero ring, if condensed with the nitrogen-containing hetero ring, may be substituted or unsubstituted. The nitrogen-containing hetero ring includes, for example, oxazole, thiazole, selenazole, pyrrole, pyrroline, imidazole and pyridine rings. The nitrogen-containing hetero ring may be condensed with an aromatic ring (e.g., benzene or naphthalene ring), and the nitrogen-containing hetero ring and its condensed ring may be further substituted. The substituents may be the same as those of the substituted alkyl group for $R^1$ in formula (1) mentioned hereinabove.

In formula (1), $X^-$ represents a group which forms an anion. The anion includes, for example, halide ions ($Cl^-$, $Br^-$, $I^-$), p-toluenesulfonate ions, ethylsulfate ions, 1,5-disulfonaphthalene di-anions, $PF_6^-$, $BF_4^-$, and $ClO_4^-$. $X^-$ may also be a substituent that substitutes the substitutable site of the cation moiety of formula (1). In this case, the compound of formula (1) forms an internal salt.

In formula (1), $R^3$ represents a group of:

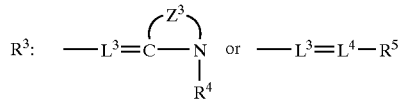

In the above, $R^4$ represents an aliphatic group or an aromatic group which is defined in the same way as the groups for $R^1$. $L^3$ and $L^4$ each independently represents a substituted or unsubstituted methine group which is defined in the same way as the group for $L^1$. $Z^3$ represents an atomic group which forms a 5-membered nitrogen-containing hetero ring, and is defined in the same way as the group for $Z^1$. Examples of $R^4$, $L^3$, $L^4$ and $Z^3$ are the same as those mentioned hereinabove for the groups of $R^1$, $L^1$ and $Z^1$; and the preferred examples are also the same as those mentioned hereinabove.

$R^5$ represents a hydrogen atom, an aliphatic group, an aromatic group, or a heterocyclic group.

The aliphatic group and the aromatic group are defined in the same way as the aliphatic group and the aromatic group for $R^1$.

The heterocyclic group may be substituted or unsubstituted. The hetero ring for the group contains any of nitrogen, oxygen and sulfur atoms, including, for example, pyridine, pyridazine, pyrimidine, pyrazine, quinoline, isoquinoline, quinoxaline, acridine, furan, pyrrole, pyrazole, imidazole, pyrroline, oxazole, thiazole, oxadiazole, thiazoline, thiophene and indole rings. The substituents of the substituted heterocyclic group are the same as those mentioned hereinabove for the substituted alkyl group.

The heterocyclic group further includes those of the following formula:

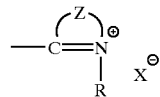

wherein R represents an aliphatic group or an aromatic group; Z represents an atomic group which forms a 5-membered or 6-membered nitrogen-containing hetero ring; and $X^-$ represents a group which forms an anion.

In the formula, Z represents an atomic group which forms a 5-membered or 6-membered nitrogen-containing hetero ring. The 5-membered ring is the same as that of the nitrogen-containing hetero ring for $Z^1$ and $Z^2$ in formula (1). Like the 5-membered ring, the 6-membered ring may be condensed with an aromatic ring and a hetero ring. The nitrogen-containing hetero ring, and also the aromatic ring and the hetero ring condensed with the nitrogen-containing hetero ring may be substituted or unsubstituted. The 6-membered nitrogen-containing hetero ring includes, for example, pyridine and pyrazine rings. The nitrogen-containing hetero ring may be condensed with an aromatic ring (e.g., benzene, naphthalene), and the nitrogen-containing hetero ring and its condensed ring may be further substituted. Examples of the substituents are the same as those mentioned hereinabove for the substituents for the substituted alkyl group for $R^1$.

R represents an aliphatic group or an aromatic group which is defined in the same way as the aliphatic group and the aromatic group for $R^1$. Preferred examples of the groups for R are the same as those of the groups for $R^1$.

$X^-$ represents a group which forms an anion which is the same as $X^-$ in formula (1).

Of the compounds of formula (1), those of the following general formula (2) or (3) are more preferred in view of ensuring higher sensitivity and better color erasability.

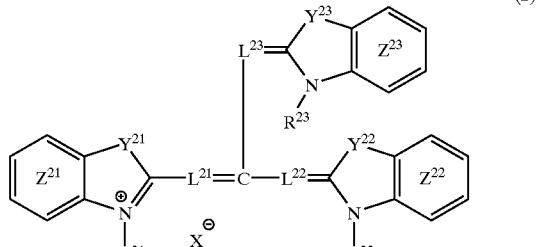

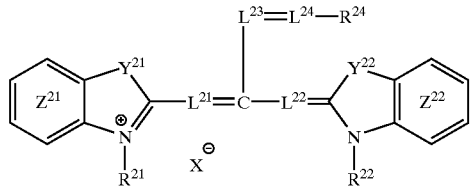

$R^{21}$ and $R^{22}$ in formulae (2) and (3), and $R^{23}$ in formula (2) each independently represents an aliphatic group or an aromatic group which is defined in the same way as the aliphatic group and the aromatic group for $R^1$ and $R^2$ in formula (1). Preferred examples of these groups are the same as those of the groups for $R^1$ and $R^2$. In formula (3), $R^{24}$ is defined in the same way as $R^5$ in formula (1), and preferred examples are the same as those of $R^5$. $L^{21}$ to $L^{23}$ in formulae (2) and (3), and $L^{24}$ in formula (3) each independently represents a substituted or unsubstituted methine group. The substituents of the substituted methine groups for any of $L^{21}$ to $L^{24}$ may be bonded to each other to form an unsaturated aliphatic ring or an unsaturated hetero ring. The methine group for $L^{21}$ to $L^{24}$ is defined in the same way as the methine group for $L^1$ and $L^2$ in formula (1), and its preferred examples are also the same as those of the methine group for $L^1$ and $L^2$.

In formulae (2) and (3), $Y^{21}$ and $Y^{22}$ each independently represents $-CR^{25}R^{26}-$, $-NR^{27}-$, $-O-$, $-S-$, $-Se-$ or $-Te-$; $R^{25}$, $R^{26}$ and $R^{27}$ each independently represents a hydrogen atom, an aliphatic group or an aromatic group; $R^{25}$ and $R^{26}$ maybe atomic groups bonded to each other to form a ring. The aliphatic group and the aromatic group are defined in the same way as the aliphatic group and the aromatic group for R1 in formula (1). For the aliphatic group, especially preferred are an alkyl group and a substituted alkyl group.

For $Y^{21}$ and $Y^{22}$, preferred are $-CR^{25}R^{26}-$, $-O-$, and $-S-$, and more preferred is $-CR^{25}R^{26}-$. For $R^{25}$ and $R^{26}$, preferred is an alkyl group.

The benzene rings $Z^{21}$ and $Z^{22}$ in formulae (2) and (3), and the benzene ring $Z^{23}$ in formula (2) may be condensed with any other benzene ring, and the benzene rings $Z^{21}$, $Z^{22}$ and $Z^{23}$, and also the condensed rings may be substituted or unsubstituted. Examples of the substituents are the same as those mentioned hereinabove for the substituted alkyl group for $R^1$ in formula (1).

$X^-$ represents a group to form an anion which is defined in the same way as $X^-$ in formula (1). Preferred examples are also the same as those of $X^-$ in formula (1).

Examples (compounds No. 1 to No. 30) of the compounds of formulae (1) to (3) are mentioned below. However, the invention is not limited to these examples.

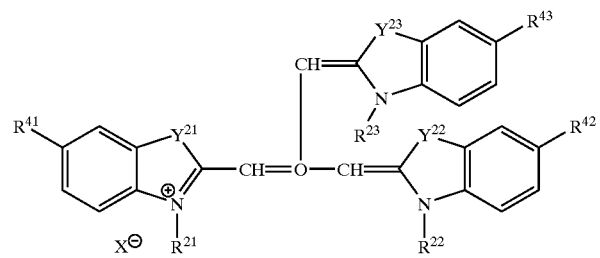

| No | $Y^{21}$ | $Y^{22}$ | $Y^{23}$ | $R^{21}$ | $R^{22}$ |
|---|---|---|---|---|---|
| 1 | S | S | S | $C_2H_5$ | $C_2H_5$ |
| 2 | S | S | S | $C_7H_{15}$ | $C_7H_{15}$ |
| 3 | S | S | S | $C_7H_{15}$ | $C_7H_{15}$ |
| 4 | S | S | S | $CH_2CO_2C_2H_5$ | $CH_2CO_2C_2H_5$ |
| 5 | S | S | S | $(CH_2)_4-SO_3^{\ominus}$ | $(CH_2)_4-SO_3^{\ominus} K^{\oplus}$ |
| 6 | S | S | S | $CH_2C{\equiv}CC_2H_5$ | $CH_2C{\equiv}CC_2H_5$ |
| 7 | S | S | S | $C_5H_{11}$ | $C_5H_{11}$ |
| 8 | S | S | S | $CH_2-C_6H_5$ | $CH_2-C_6H_5$ |
| 9 | S | S | S | $CH_2CON(C_4H_9)_2$ | $CH_2CON(C_4H_9)_2$ |
| 10 | O | O | O | $C_7H_{15}$ | $C_7H_{15}$ |
| 11 | $N-C_4H_9$ | $N-C_4H_9$ | $N-C_4H_9$ | $C_4H_9$ | $C_4H_9$ |
| 12 | $N-CH_2CH{=}CH_2$ | $N-CH_2CH{=}CH_2$ | $N-CH_2CH{=}CH_2$ | $CH_2CH{=}CH_2$ | $CH_2CH{=}CH_2$ |
| 13 | Se | Se | Se | $C_2H_5$ | $C_2H_5$ |
| 14 | Te | Te | Te | $C_2H_5$ | $C_2H_5$ |

| No | $R^{23}$ | $R^{41}$ | $R^{42}$ | $R^{43}$ | $X^{\ominus}$ |
|---|---|---|---|---|---|
| 1 | $C_2H_5$ | H | H | H | $Cl^{\ominus}$ |
| 2 | $C_7H_{15}$ | H | H | H | $CH_3-C_6H_4-SO_3^{\ominus}$ |
| 3 | $C_7H_{15}$ | $SO_2CH_3$ | $SO_2CH_3$ | $SO_2CH_3$ | $ClO_4^{\ominus}$ |
| 4 | $CH_2CO_2C_2H_5$ | H | H | H | $Br^{\ominus}$ |
| 5 | $(CH_2)_4-SO_3^{\ominus} K^{\oplus}$ | H | H | H | — |
| 6 | $CH_2C{\equiv}CC_2H_5$ | $SO_2CH_3$ | $SO_2CH_3$ | $SO_2CH_3$ | $CF_3SO_3^{\ominus}$ |
| 7 | $C_5H_{11}$ | $CH_3$ | $CH_3$ | $CH_3$ | $CH_3SO_3^{\ominus}$ |
| 8 | $CH_2-C_6H_5$ | $OCH_3$ | $OCH_3$ | $OCH_3$ | $I^{\ominus}$ |
| 9 | $CH_2CON(C_4H_9)_2$ | Cl | Cl | Cl | $PF_6^{\ominus}$ |
| 10 | $C_7H_{15}$ | H | H | H | $I^{\ominus}$ |
| 11 | $C_4H_9$ | H | H | H | $I^{\ominus}$ |
| 12 | $CH_2CH{=}CH_2$ | H | H | H | $CF_3SO_3^{\ominus}$ |
| 13 | $C_2H_5$ | H | H | H | $I^{\ominus}$ |
| 14 | $C_2H_5$ | H | H | H | $I^{\ominus}$ |

No. 15
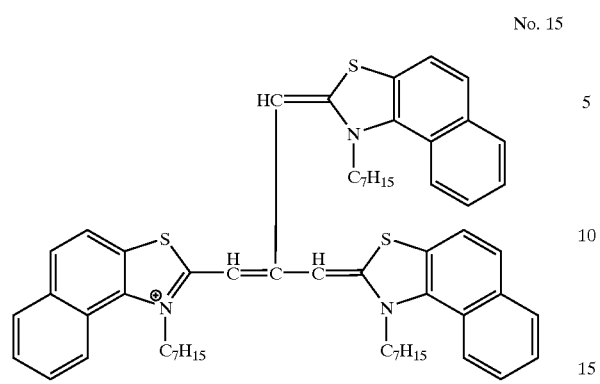
No. 19
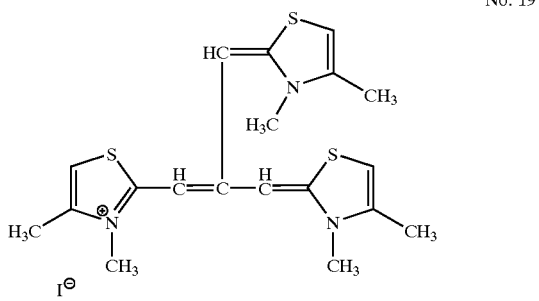
No. 16
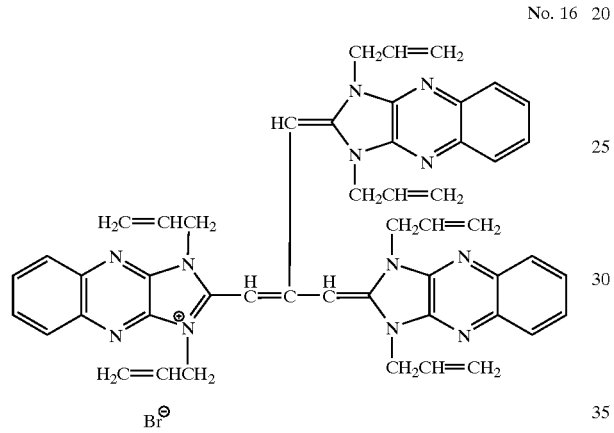
No. 20
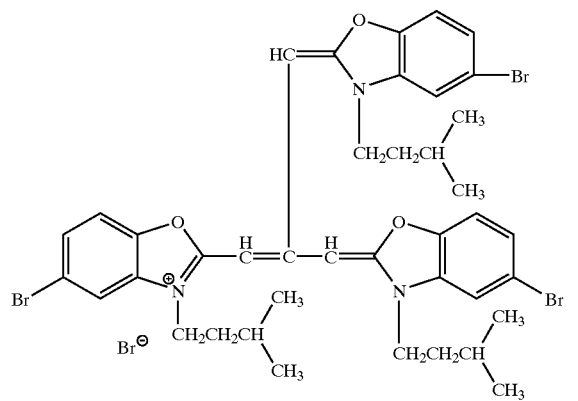
No. 17
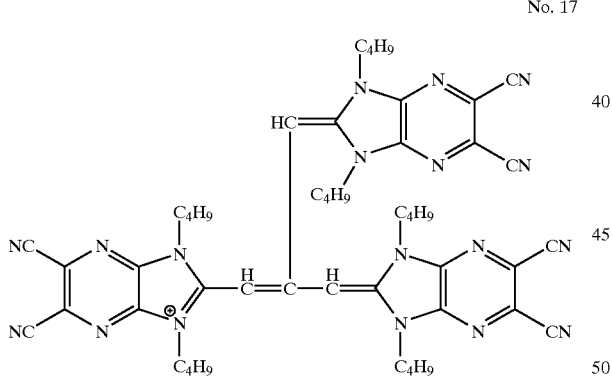
No. 21
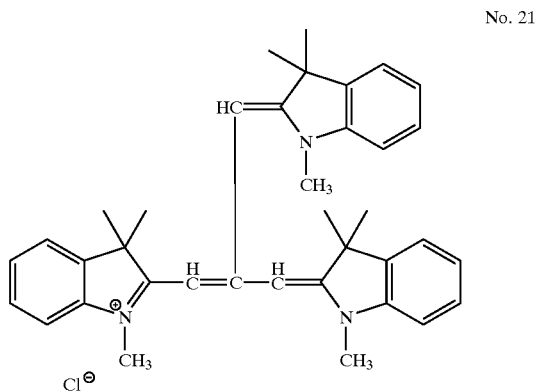
No. 18
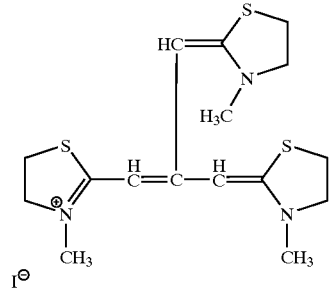
No. 22
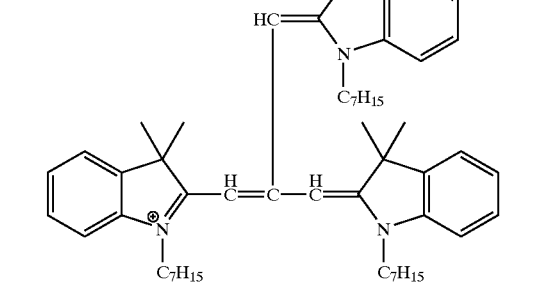
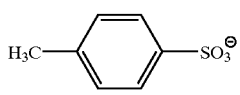

-continued

No. 23
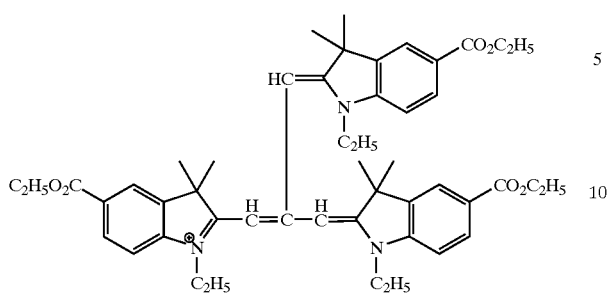

No. 24
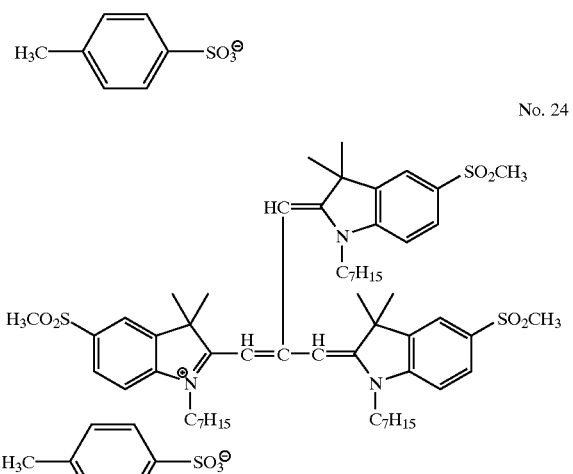

No. 25
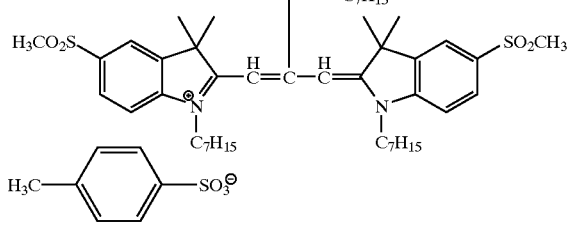

No. 26
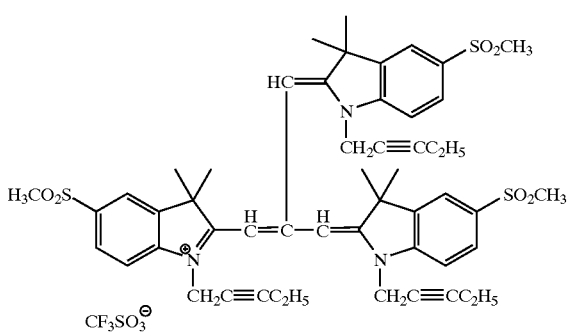

No. 27
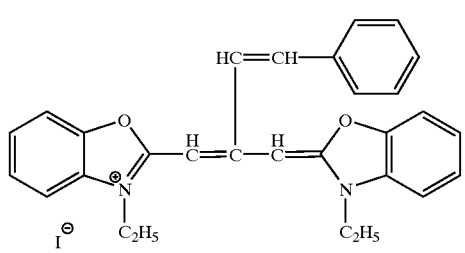

-continued

No. 28
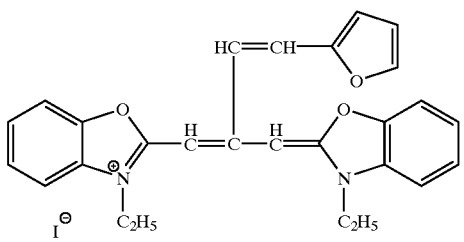

No. 29
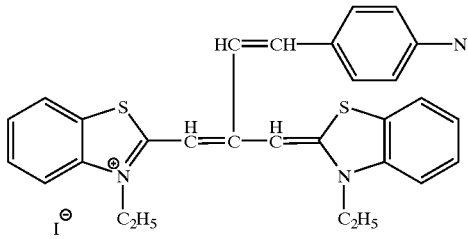

No. 30
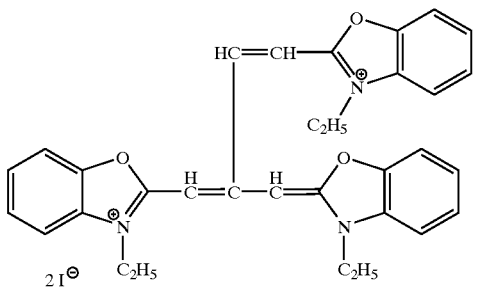

One or more of the compounds of formulae (1) to (3) may be used herein, either singly or combined.

The amount of the compound of any of formulae (1) to (3) to be in the photopolymerizable composition of the invention preferably falls between 0.01 and 5 parts by weight, more preferably between 0.05 and 2 parts by weight, relative to one part by weight of the radical generator therein. The radical generator is described in detail hereinunder.

If the content of the compound is smaller than 0.01 parts by weight, the photopolymerization sensitivity of the composition will be low; but if larger than 5 parts by weight, a long time will be needed for color erasure.

By the compound of any of formulae (1) to (3) being included therein, the photopolymerizable composition has an increased photopolymerization sensitivity, and is highly sensitive to not only UV rays but also rays in the visible to IR range. In addition, the compounds of formulae (1) to (3) are sufficiently decomposed by the radicals generated by the radical generator which interacts with the compound, and their colors are erased without requiring much time, or that is, the compounds have good color erasability. Therefore, as will be described hereinunder, even when they are used in recording materials to be processed in a completely dry system which does not require developer, the non-image area (background area) of the processed, image-recorded material is prevented from being colored, and sharp and high-contrast images are recorded on the material.

Compound of Formula (4):

In another aspect of the invention, the photopolymerizable composition contains, as a spectral sensitizing dye, a compound of formula (4) mentioned below. Like the compound of formula (1), the dye is a cyanine dye, and has the function of spectrally sensitizing the radical generator in the composition. The compound of formula (4) works in the same way as the compound of formula (1).

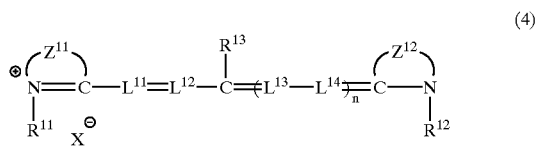

(4)

In formula (4), $R^{11}$, $R^{12}$ and $R^{13}$ each represent an aliphatic group or an aromatic group which is defined in the same way as $R^1$, $R^2$ and $R^3$ in formula (1), and their preferred examples are also the same as those of $R^1$, $R^2$ and $R^3$ in formula (1). $L^{11}$, $L^{12}$, $L^{13}$ and $L^{14}$ each independently represents a substituted or unsubstituted methine group which is defined in the same way as $L^1$ and $L^2$ in formula (1), and their preferred examples are also the same as those of $L^1$ and $L^2$ in formula (1). $Z^{11}$ and $Z^{12}$ each independently represents an atomic group which forms a 5-membered nitrogen-containing hetero ring, and are defined in the same way as $Z^1$ and $Z^2$ in formula (1), and preferred examples are also the same as those of $Z^1$ and $Z^2$ in formula (1) n indicates 0, 1 or 2.

Of the compounds of formula (4), those of the following general formula (5) or (6) are more preferred in view of ensuring higher sensitivity and better color erasability.

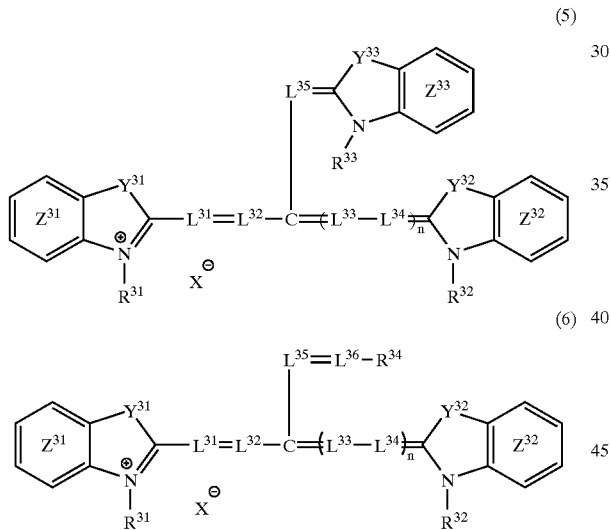

$R^{31}$ and $R^{32}$ in formulae (5) and (6), and $R^{33}$ in formula (5) each independently represents an aliphatic group or an aromatic group, having the same meanings as those for $R^{21}$ and $R^{22}$ in formulae (2) ad (3). Preferred examples of these groups are the same as those of the groups for $R^{21}$ and $R^{22}$. In formula (6), $R^{34}$ is defined in the same way as $R^{24}$ in formula (3), and preferred examples are the same as those of $R^{24}$. $L^{31}$, $L^{32}$, $L^{33}$, $L^{34}$, $L^{35}$ in formulae (5) and (6), and $L^{36}$ in formula (6) each independently represents a substituted or unsubstituted methine group. The substituents of the substituted methine groups for any of these $L^{31}$ to $L^{36}$ may be bonded to each other to form an unsaturated aliphatic ring or an unsaturated hetero ring. The methine group for $L^{31}$ to $L^{36}$ is defined in the same way as the methine group for $L^1$ and $L^2$ in formula (1), and its preferred examples are also the same as those of the methine group for $L^1$ and $L^2$.

In formulae (5) and (6), $Y^{31}$, $Y^{32}$ and $Y^{33}$ each independently represents —$CR^{35}R^{36}$—, —$NR^{37}$—, —O—, —S—, —Se— or —Te—; $R^{35}$, $R^{36}$ and $R^{37}$ each independently represents a hydrogen atom, an aliphatic group or an aromatic group; $R^{35}$ and $R^{36}$ maybe atomic groups bonded to each other to form a ring. The aliphatic group and the aromatic group are defined in the same way as the aliphatic group and the aromatic group for $R^1$ in formula (1). For the aliphatic group, especially preferred are an alkyl group and a substituted alkyl group.

For $Y^{31}$ and $Y^{32}$, preferred are —$CR^{35}R^{36}$—, —O—, and —S—, and more preferred is —$CR^{35}R^{36}$—. For $R^{35}$ and $R^{36}$, preferred is an alkyl group.

The benzene rings $Z^{31}$ and $Z^{32}$ in formulae (5) and (6), and the benzene ring $Z^{33}$ in formula (5) may be condensed with any other benzene ring, and the benzene rings $Z^{31}$, $Z^{32}$ and $Z^{33}$, and also the condensed rings may be substituted or unsubstituted. Examples of the substituents are the same as those mentioned hereinabove for the substituted alkyl group for $R^1$ in formula (1).

In formulae (4) to (6), $X^-$ represents a group which forms an anion which is defined in the same way as $X^-$ in formula (1).

Examples (compounds No. 31 and No. 32) of the compounds of formulae (4) to (6) are shown below. However, the invention is not limited to these examples.

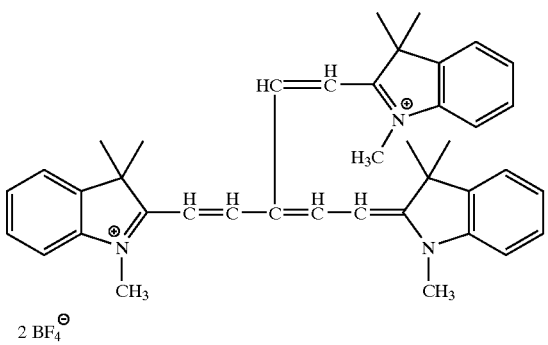

No. 31

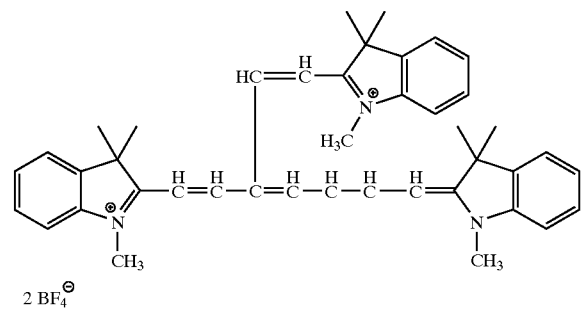

No. 32

One or more of the compounds of formulae (4) to (6) may be used herein, either singly or combined.

The amount of the compound of any of formulae (4) to (6) to be included in the photopolymerizable composition of the invention preferably falls between 0.01 and 5 parts by weight, more preferably between 0.05 and 2 parts by weight, relative to one part by weight of the radical generator therein. The radical generator is described in detail hereinunder.

If the content of the compound is smaller than 0.01 parts by weight, the photopolymerization sensitivity of the composition will be low; but if larger than 5 parts by weight, a long time will be needed for color erasure.

By a compound of any of formulae (4) to (6) being included therein, the photopolymerizable composition has an increased photopolymerization sensitivity, and is highly sensitive to not only UV rays but also rays in the visible to IR range. In addition, the compounds of formulae (4) to (6) are sufficiently decomposed by the radicals generated by the radical generator which interacts with the compound, and their colors are properly erased without requiring much time, or that is, the compounds have good color erasability. Therefore, as will be described hereinunder, even when they are used in recording materials to be processed in a completely dry system which does not require developer, the non-image area (background area) of the processed, image-recorded material is prevented from being colored, and sharp and high-contrast images are recorded on the material.

Of the compounds of formulae (2) and (3) which are preferred examples of the compounds of formula (1), and the compounds of formula (5) and (6) which are preferred examples of the compounds of formula (4), those of formulae (2) and (3) are more preferred in view of ensuring higher photosensitivity, and even more preferred are those of formula (2).

In the compounds of formulae (1) and (4), the nitrogen-containing hetero rings for $Z^1$ and $Z^2$ ($Z^{11}$ and $Z^{12}$) are preferably 5-membered rings, in view of ensuring higher photosensitivity. On the other hand, the compounds of formula (1) in which the nitrogen-containing hetero rings are 6-membered quinoline ring are undesirable, since their absorption wavelength range is broad and their photosensitivity is low. In the compounds of formulae (1) and (4), introducing a specific group such as $R^3$ or $R^{13}$, is effective for increasing the photosensitivity of the compounds.

Radical Generator:

The photopolymerizable composition of the invention contains a radical generator that interacts with the spectral sensitizing dye therein to generate a radical. By including the radical generator along with the spectral sensitizing dye, the sensitivity of the composition to light that falls within the spectral absorption wavelength range of the dye is increased, and, therefore, when the composition is exposed to light that falls within the spectral absorption wavelength range of the dye therein, the efficiency in radical generation of the radical generator in the composition is increased and the photosensitivity of the composition is thereby increased. Accordingly, any desired light source falling within a range from visible rays to IR rays can be used for exposing the composition to light, and the radical generation in the thus-exposed composition can be controlled in any desired manner.

The radical generator to be included in the photopolymerizable composition may be any one or more radical generators capable of initiating the polymerization of the polymerizable compound in the composition.

Examples of the radical generator includes benzophenone, camphorquinone, 4,4-bis(dimethylamino) benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone; bisacylphosphine oxides such as bis(2,4,6-trimethylbenzoyl) phenylphosphine oxide; acylphosphine oxides such as Lucirin TPO; aromatic ketones such as α-hydroxy or α-aminoacetophenones, α-hydroxycycloalkyl phenyl ketones, dialkoxyacetophenones; benzoin and benzoin ethers such as benzoin methyl ether, benzoin ethyl ether, benzoin isopropyl ether, benzoin phenyl ether; 2,4,6-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer; compounds described in U.S. Pat. Nos. 3,784,557, 4,252,887, 4,311,783, 4,459,349, 4,410,621, 4,622,286; polyhalogen compounds such as carbon tetrabromide, phenyl tribromomethyl sulfone, phenyl trichloromethyl ketone; compounds described in JP-A 59-133428, JP-B 57-1819, 57-6096, U.S. Pat. No. 3,615,455; S-triazine derivatives having a trihalogen-substituted methyl group described in JP-A 59-29803, such as 2,4,6-tris(trichloromethyl)-S-triazine, 2-methoxy-4,6-bis (trichloromethyl)-S-triazine, 2-amino-4,6-bis (trichloromethyl)-S-triazine, 2-(p-methoxystyryl)-4,6-bis (trichloromethyl)-S-triazine; organic peroxides described in JP-A 59-189340, such as methyl ethyl ketone peroxide, cyclohexaneperoxide, 3,3,5-trimethylcyclohexanone peroxide, benzoyl peroxide, di-tert-butyl diperoxyisophthalate, 2,5-dimethyl-2,5-di(benzoylperoxy) hexane, tert-butyl peroxybenzoate, a,a'-bis(tert-butylperoxyisopropyl)benzene, dicumyl peroxide, 3,3',4,4'-tetra(tert-isobutylperoxycarbonyl)benzophenone; azinium salts described in U.S. Pat. No. 4,743,530; organoboron compounds; phenylglyoxalates such as methyl phenylglyoxalate; titanocenes such as bis($\eta^5$-2,4-cyclopentadien-1-yl)-bis(2,6-difluoro-3-(1H-pyrrol-1-yl)-phenyl)titanium; iron allene complexes such as $\eta^5$-cyclopentadienyl-$\eta^6$-cumenyl-iron (1+)-hexafluorophosphate (1−); diaryliodonium salts such as diphenyliodinium salt; and triarylsulfonium salts such as triphenylsulfonium salt.

The details of the radical generator compounds mentioned above, and other examples of different types of radical generator compounds are described in JP-A 10-45816, paragraphs [0067] to [0132].

The radical generator for use in the invention may be a combination of two or more different types of compounds mentioned above. For example, herein employable are a combination of 2,4,5-triarylimidazole dimer and mercaptobenzoxazole; a combination of 4,4'-bis(dimethylamino) benzophenone, benzophenone and benzoin methyl ether as in U.S. Pat. No. 3,427,161; a combination of benzoyl-N-methylnaphthothiazoline and 2,4-bis(trichloromethyl)-6-(4'-methoxyphenyl)-triazoleasin U.S. Pat. No. 4,239,850; a combination of dialkylaminobenzoate and dimethylthioxanthone as in JP-A 57-23602; and a combination of three, 4,4'-bis (dimethylamino) benzophenone, benzophenone and polyhalogenomethyl compound, as in JP-A 59-78339.

For two or more different types of radical generators to be combined, preferred are a combination of 4,4'-bis (diethylamino)benzophenone and benzophenone; a combination of 2,4-diethylthioxanthone and ethyl 4-dimethylaminobenzoate; and a combination of 4,4'-bis (diethylamino)benzophenone and 2,4,5-triarylimidazole dimer.

Of the radical generators mentioned above, preferred are organoboron compounds, diaryliodonium salts, iron allene complexes, S-triazine derivatives having a trihalogen-substituted methyl group, organic peroxides, titanocenes, 2,4,5-triarylimidazole dimers, and azinium salts, as they interact well with a dye to thereby more effectively generate radicals in exposed regions, and as they ensure higher sensitivity. Especially preferred are organoboron compounds. The organoboron compounds, when used along with spectral sensitizing compounds or dyes in recording materials, act to more favorably erase the colors of the spectral sensitizing dyes in image fixation on the materials through their exposure to light. If desired, the organoboron compounds may be combined with any of the above-mentioned radical generators.

Examples of the organoboron compounds usable herein include compounds of formula (A) mentioned below, as well as spectral sensitizing dye-type organoboron compounds having, in their structure, a cationic dye in the cation moiety, such as those described in *Chemistry of Functional Dyes* (1981, by CMC Publishing, pp. 393–416) and *Colorants* (60 [4] 212–224, 1987). Examples of such spectral sensitizing dye-type organoboron compounds are described in, for example, JP-A 62-143044, 1-138204, International Patent Publication No. 6-505287, and JP-A 4-261406.

The dye to form the cation moiety in the spectral sensitizing dye-type organoboron compounds may be a cationic dye having a maximum absorption wavelength in a wavelength range of 300 nm or less, preferably in a wavelength range of from 400 to 1100 nm. For this, especially preferred are cationic methine dyes, polymethine dyes, triarylmethane dyes, indoline dyes, azine dyes, xanthene dyes, cyanine dyes, hemicyanine dyes, rhodamine dyes, azomethine dyes, oxazine dyes and acridine dyes; and more preferred are cationic cyanine dyes, hemicyanine dyes, rhodamine dyes and azomethine dyes.

For the organoboron compounds, also preferred are compounds of the general formula (A):

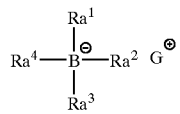

In formula (A), $R_a^1$, $R_a^2$, $R_a^3$ and $R_a^4$ each independently represents an aliphatic group, an aromatic group, a heterocyclic group, or Si $(R_a^5)(R_a^6)$—$R_a^7$.

The aliphatic group for $R_a^1$ to $R_a^4$ includes, for example, an alkyl group, a substituted alkyl group, an alkenyl group, a substituted alkenyl group, an alkynyl group, a substituted alkynyl group, an aralkyl group, and a substituted aralkyl group. For these, preferred are an alkyl group, a substituted alkyl group, an alkenyl group, a substituted alkenyl group, an aralkyl group, and a substituted aralkyl group; and more preferred are an alkyl group and a substituted alkyl group.

The aliphatic group may be cyclic or linear. The linear aliphatic group may be branched.

The alkyl group may be linear, branched or cyclic, preferably having from 1 to 30 carbon atoms, more preferably from 1 to 20 carbon atoms. The alkyl group may be substituted or unsubstituted. The preferred range of the number of carbon atoms constituting the alkyl moiety of the substituted alkyl group is the same as that for the unsubstituted alkyl group.

The alkyl group includes, for example, methyl, ethyl, propyl, butyl, pentyl, hexyl, cyclopentyl, neopentyl, isopropyl, isobutyl, cyclohexyl, octyl, 2-ethylhexyl, decyl, dodecyl and octadecyl groups.

The substituent of the substituted alkyl group includes, for example, a carboxyl group, a sulfo group, a cyano group, a halogen atom (e.g., fluorine, chlorine, bromine), a hydroxyl group, an alkoxycarbonyl group having at most 30 carbon atoms (e.g., methoxycarbonyl, ethoxycarbonyl, benzyloxycarbonyl), an alkylsulfonylaminocarbonyl group having at most 30 carbon atoms, an arylsulfonylaminocarbonyl group, an alkylsulfonyl group, an arylsulfonyl group, an acylaminosulfonyl group having at most 30 carbon atoms, an alkoxy group having at most 30 carbon atoms (e.g., methoxy, ethoxy, benzyloxy, phenethyloxy), an alkylthio group having at most 30 carbon atoms (e.g., methylthio, ethylthio, methylthioethylthioethyl), an aryloxy group having at most 30 carbon atoms (e.g., phenoxy, p-tolyloxy, 1-naphthoxy, 2-naphthoxy), a nitro group, an alkyl group having at most 30 carbon atoms, an alkoxycarbonyloxy group, an aryloxycarbonyloxy group, an acyloxy group having at most 30 carbon atoms (e.g., acetyloxy, propionyloxy), an acyl group having at most 30 carbon atoms (e.g., acetyl, propionyl, benzoyl), a carbamoyl group (e.g., carbamoyl, N,N-dimethylcarbamoyl, morpholinocarbonyl, piperidinocarbonyl), a sulfamoyl group (e.g., sulfamoyl, N,N-dimethylsulfamoyl, morpholinosulfonyl, piperidinosulfonyl), an aryl group having at most 30 carbon atoms (e.g., phenyl, 4-chlorophenyl, 4-methylphenyl, α-naphthyl), a substituted amino group (e.g., amino, alkylamino, dialkylamino, arylamino, diarylamino, acylamino), a substituted ureido group, a substituted phosphono group, and a heterocyclic group. Of those, the carboxyl group, the sulfo group, the hydroxyl group and the phosphono group may be in the form of their salts. The cations to form the salts may be those of $G^+$ mentioned below.

The alkenyl group may be linear, branched or cyclic. Preferably, it has from 2 to 30 carbon atoms, more preferably from 2 to 20 carbon atoms. The alkenyl group may be substituted or unsubstituted. The preferred range of the number of carbon atoms constituting the alkenyl moiety in the substituted alkenyl group is the same as that mentioned above for the alkenyl group.

The substituents of the substituted alkenyl group are the same as those mentioned above for the substituted alkyl group.

The alkynyl group may be linear, branched or cyclic. Preferably, it has from 2 to 30 carbon atoms, more preferably from 2 to 20 carbon atoms. Thealkynyl group maybe substituted or unsubstituted. The preferred range of the number of carbon atoms constituting the alkynyl moiety in the substituted alkynyl group is the same as that mentioned above for the alkynyl group.

The substituents of the substituted alkynyl group are the same as those mentioned above for the substituted alkyl group.

The aralkyl group may be linear, branched or cyclic. Preferably, it has from 7 to 35 carbon atoms, more preferably from 7 to 25 carbon atoms. The aralkyl group may be substituted or unsubstituted. The preferred range of the number of carbon atoms constituting the aralkyl moiety in the substituted aralkyl group is the same as that mentioned above for the aralkyl group.

The substituents of the substituted aralkyl group are the same as those mentioned above for the substituted alkyl group.

The aromatic group for $R_a^1$ to $R_a^4$ includes, for example, an aryl group and a substituted aryl group. Preferably, the aryl group has from 6 to 30 carbon atoms, more preferably from 6 to 20 carbon atoms. The preferred range of the number of carbon atoms constituting the aryl moiety in the substituted aryl group is the same as that mentioned above for the aryl group. The aryl group includes, for example, phenyl, α-naphthyl and β-naphthyl groups.

The substituents of the substituted aryl group are the same as those mentioned above for the substituted alkyl group.

The heterocyclic group for $R_a^1$ to $R_a^4$ may be substituted or unsubstituted. The substituents of the substituted heterocyclic group are the same as those mentioned hereinabove for the substituted aryl group for $R_a^1$ to $R_a^4$.

For the heterocyclic groups for $R_a^1$ to $R_a^4$, preferred are those containing any of nitrogen, sulfur and oxygen atoms.

For example, they include furan, pyrrole, imidazole, oxazole, thiazole and pyridine rings.

$R_a^5$, $R_a^6$ and $R_a^6$ in $-Si(R_a^5)(R_a^6)-R_a^7$ for $R_a^1$ to $R_a^4$ each independently represents an aliphatic group or an aromatic group which is defined in the same way as the aliphatic group and the aromatic group for $R_a^1$ to $R_a^4$ and their preferred examples are also the same as those of $R_a^1$ to $R_a^4$.

In formula (A), any two or more of $R_a^1$, $R_a^2$, $R_a^3$ and $R_a^4$ may bond to each other, directly or via a linking group therebetween, to form a ring. The ring, if so formed, is preferably selected from rings (C1) to (C3) mentioned below.

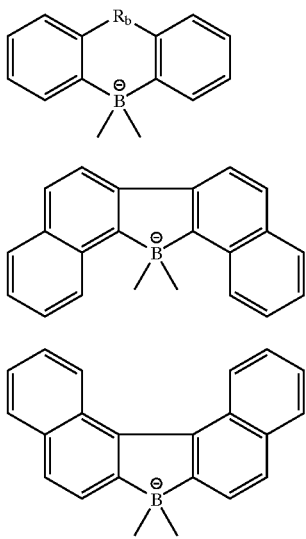

In the ring (C1), $R_b$ is a divalent group of the following:

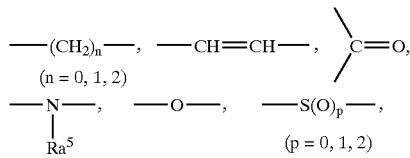

($R_a^5$ indicates H or a monovalent substituent)

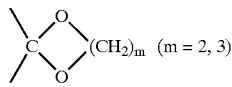

Of the organoboron compounds of formula (A), preferred are those in which at least one of $R_a^1$ to $R_a^4$ is an alkyl group. More preferred are triarylalkyl compounds of formula (A) in which one of $R_a^1$ to $R_a^4$ is an alkyl group and the remaining three are aryl groups, in view of ensuring higher sensitivity and better storability.

Especially preferred are triarylalkyl-type organoboron compounds in which at least one aryl group is substituted with an electron-attracting group. Even more preferred are those in which the total of the Hammet values (σ) of the substituents (electron-attracting groups) of the three aryl groups falls between +0.36 and +2.58.

For the electron-attracting group, preferred are a halogen atom and a trifluoromethyl group; and more preferred are fluorine and chlorine atoms.

The aryl group substituted with an electron-attracting group includes, for example, 3-fluorophenyl, 4-fluorophenyl, 2-fluorophenyl, 3-chlorophenyl, 4-chlorophenyl, 3-trifluoromethylphenyl, 4-trifluoromethylphenyl, 3,5-difluorophenyl, 4-bromophenyl, 3,4-difluorophenyl, 5-fluoro-2-methylphenyl, 5-fluoro-4-methylphenyl, 5-chloro-2-methylphenyl and 5-chloro-4-methylphenyl groups.

The anion moiety in formula (A) includes, for example, tetramethyl borate, tetraethyl borate, tetrabutyl borate, tri-isobutylmethyl borate, di-n-butyl-di-t-butyl borate, tri-m-chlorophenyl-n-hexyl borate, triphenylmethyl borate, triphenylethyl borate, triphenylpropyl borate, triphenyl-n-butyl borate, trimesitylbutyl borate, tritolylisopropyl borate, triphenylbenzyl borate, tetra-m-fluorobenzyl borate, triphenylphenethyl borate, triphenyl-p-chlorobenzyl borate, triphenylethenylbutyl borate, di(α-naphthyl)-dipropyl borate, triphenylsilyltriphenyl borate, tritoluylsilyltriphenyl borate, tri-n-butyl(dimethylphenylsilyl) borate, diphenyldihexyl borate, tri-m-fluorophenylhexyl borate, tri(5-chloro-4-methylphenyl)hexyl borate, tri-m-fluorophenylcyclohexyl borate, and tri(5-fluoro-2-methylphenyl)hexyl borate.

In formula (A), $G^+$ represents a group to form a cation. For this, especially preferred are organic cationic compounds, transition metal-coordinated complex cations (e.g., compounds described in JP 2,791,143) and metal cations (e.g., $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, ½$Ca^{2+}$).

The organic cationic compounds include, for example, quaternary ammonium cations, quaternary pyridinium cations, quaternary quinolinium cations, phosphonium cations, iodonium cations, sulfonium cations, and dye cations.

The quaternary ammonium cations include, for example, tetraalkylammoniumcations (e.g., tetramethylammoniumcation, tetrabutylammonium cation), and tetraarylammonium cations (e.g., tetraphenylammonium cation). The quaternary pyridinium cations include, for example, N-alkylpyridinium cations (e.g., N-methylpyridinium cation), N-arylpyridinium cations (e.g., N-phenylpyridinium cation), N-alkoxypyridinim cations (e.g., 4-phenyl-N-methoxy-pyridinium cation), and N-benzoylpyridinium cations. The quaternary quinolinium cations include, for example, N-alkylquinolinium cations (e.g., N-methylquinolinium cation), and N-arylquinolinium cations (e.g., N-phenylquinolinium cation). The phosphonium cations include, for example, tetraarylphosphonium cations (e.g., tetraphenylphosphonium cation). The iodonium cations include, for example, diaryliodonium cations (e.g., diphenyliodonium cation). The sulfonium cations include, for example, triarylsulfonium cations (e.g., triphenylsulfonium cation).

Other examples of $G^+$ are the compounds described in JP-A 9-188686, paragraphs [0020] to [0038].

In the cationic compounds mentioned above (the examples), the alkyl group preferably has from 1 to 30 carbon atoms. Preferably, for example, it is an unsubstituted alkyl group such as amethyl, ethyl, propyl, isopropyl, butyl orhexyl group, or a substituted alkyl group such as that mentioned hereinabove for $R_a^1$ to $R_a^4$. More preferably, the alkyl group has from 1 to 12 carbon atoms.

In the cationic compounds mentioned above, the aryl group is preferably a phenyl group, a halogen (e.g., chlorine)-substituted phenyl group, an alkyl (e.g., methyl)-substituted phenyl group, or an alkoxy (e.g., methoxy)-substituted phenyl group.

Examples of the organoboron compounds of formula (A) are the compounds described in U.S. Pat. Nos. 3,567,453, 4,343,891, JP-A 62-143044, 62-150242, 9-188684, 9-188685, 9-188686, 9-188710, JP-B 8-9643, and JP-A 11-269210, and the compounds shown below. For use in the invention, the organoboron compound may be combined with any other radical generators mentioned hereinunder. However, the organoboron compounds to be used in the invention are not limited to these specific examples.

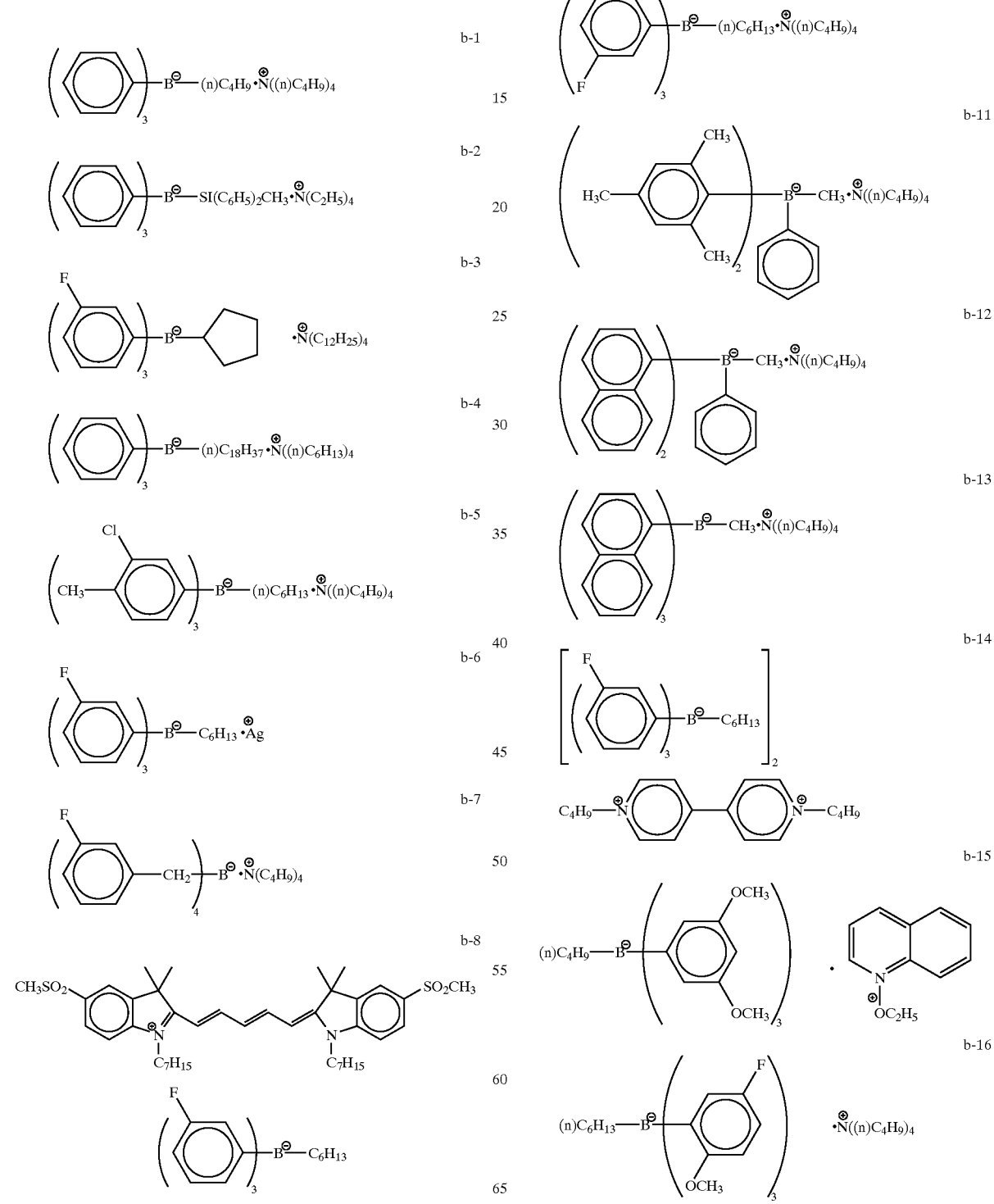

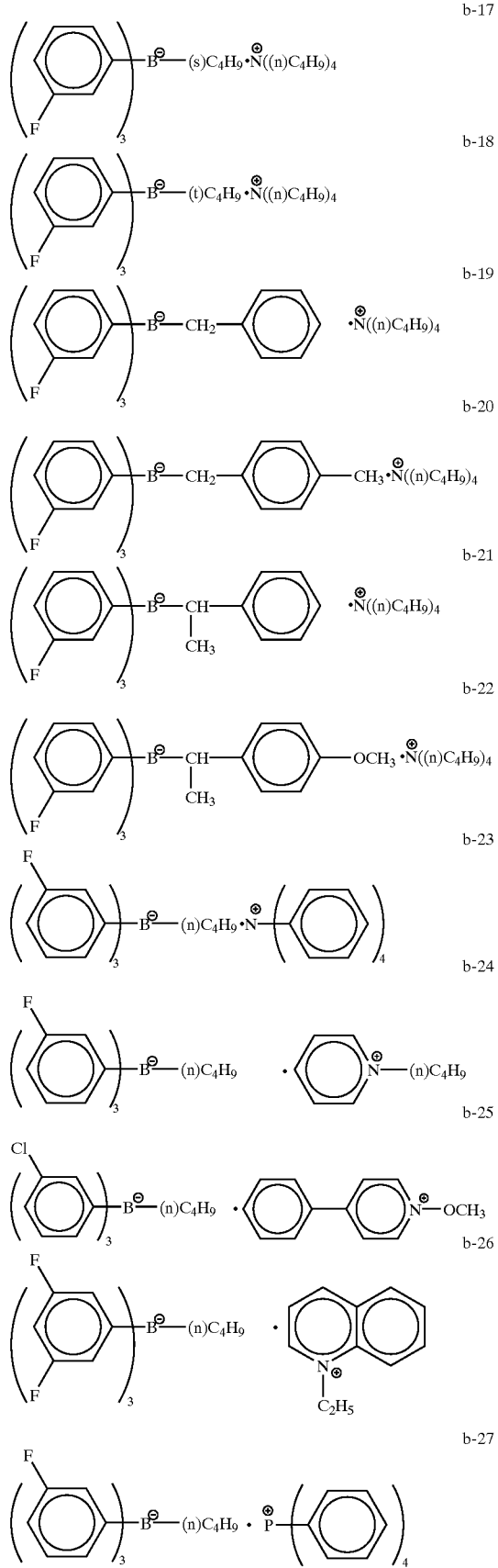

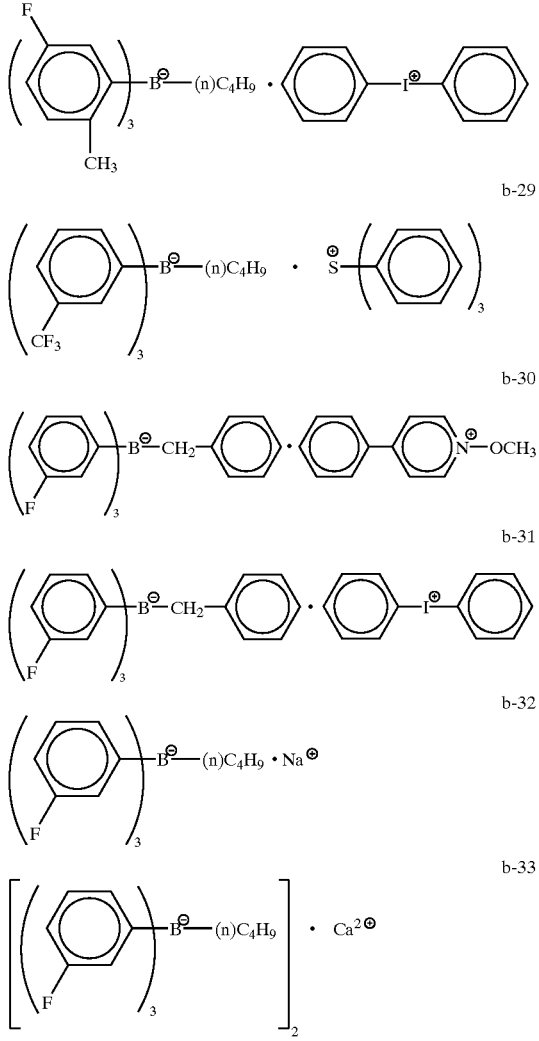

The content of the radical generator in the photopolymerizable composition preferably falls between 0.01 and 20% by weight, more preferably between 0.1 and 10% by weight of the content of the polymerizable compound having an ethylenic unsaturated bond therein. However, its preferred range varies, depending on the type of the "ethylenic unsaturated bond-having polymerizable compound" in the composition, and therefore should not be limited to the above.

Additional Components:

Depending on its purpose, the photopolymerizable composition of the invention may additionally contain any known additives in a range such that the effect of the invention is not impaired.

The additional components include, for example, photopolymerization initiator, oxygen scavenger, thermal polymerization inhibitor, UV absorbent, fluorescent brightener, chain transfer agent, antioxidant, and their precursors. Preferably, their content in the photopolymerizable composition falls between 0.01 and 20% by weight, more preferably between 0.5 and 10% by weight of the overall weight of the composition.

Examples of the chain transfer agent and the antioxidant are described in, for example, JP-A10-45816, paragraphs

[0135] to [0141]; JP-A 9-188686, paragraphs [0087] to [0096]; JP-A 10-182621, paragraphs [0079] to [0118]; JP-A 9-95487, paragraphs [0080] to [0089]; and also in JP-A1-13140, 1-13141, 1-13143, 1-13144, 1-17048, 1-229003, 1-298348, 10-138638, 11-269210 and 2-187762.

The photopolymerizable composition of the invention may contain a binder. In the case where the composition is a liquid or viscous substance, adding a binder thereto is preferred.

The binder content of the composition preferably falls between 5 and 95% by weight, more preferably between 10 and 90% by weight, most preferably between 15 and 85% by weight of the total solid content of the composition.

Selecting the binder to be included in the composition depends on the applications of the composition and on the properties thereof for the applications, for example, on the developability of the composition in an aqueous or organic solvent system, on the adhesiveness thereof to substrates and on the sensitivity thereof to oxygen.

For the binder, preferred are polymers having a molecular weight of from about 5000 to 2000000, more preferably from about 10000 to 1000000. Examples include acrylate and methacrylate homo- or copolymers (e.g., methyl methacrylate/ethyl acrylate/methacrylic acid copolymers, poly(alkyl methacrylates), poly(alkyl acrylates)), cellulose esters or cellulose ethers (e.g., cellulose acetate, cellulose acetobutyrate, methyl cellulose, ethyl cellulose), polyvinyl butyrals, polyvinyl formals, cyclic rubbers, polyethers (e.g., polyethylene oxide, polypropylene oxide, polytetrahydrofuran), polystyrenes, polycarbonates, polyurethanes, polychloro-olefins, polyvinyl chlorides, vinyl chloride/vinylidene chloride copolymers, vinylidene chloride/acrylonitrile copolymers, methyl methacrylate, vinyl acetate, polyvinyl acetates, copoly(ethylene/vinyl acetates), polycaprolactams, poly(hexamethylenadipamides), polyesters (e.g., poly(ethylene glycol terephthalate), poly(hexamethylene glycol succinate)), polyamides, and polyurethanes.

Also usable for the binder are water-soluble polymers such as gelatins, (modified) polyvinyl alcohols, polyvinyl pyrrolidones, hydrolyzates of styrene-maleic acid copolymers, sodium polystyrenesulfonates and sodium alginates. In addition, also usable are latexes such as styrene-butadiene rubber latexes, acrylonitrile-butadiene rubber latexes, methyl acrylate-butadiene rubber latexes.

An unsaturated compound may also be used as a mixture with a non-photopolymerizable film-forming component. Examples include a physically-dried polymer or a polymer solution in an organic solvent, including, for example, nitrocellulose and cellulose actobutyrate. However, they may be chemically and/or thermally-curable (thermosetting) resins, such as polyisocyanates, polyepoxides, melamine resins, as well as polyimide precursors. Using such a thermosetting resin along with the photopolymerizable composition is important in order to use the composition in known hybrid systems that are photopolymerized in a first stage and then crosslinked through thermal post-treatment in a second stage.

Also usable herein are binders having a polymerizing group.

Examples of the other additives usable herein are described in, for example, JP-A 11-269210.

The light source to be used for imagewise exposing of the composition to light therefrom may be selected from any known light sources having a wavelength range from visible rays to IR rays. Especially preferred are light sources having a maximum absorption wavelength that falls between 300 and 1000 nm. For example, preferred are blue, green or red (semiconductor) laser sources or LEDs, as the device may be compact and small-sized and they are inexpensive. For ensuring higher sensitivity, preferably used are light sources having a wavelength range corresponding to that of light capable of being absorbed by the light-absorbing material, such as spectral sensitizing dye, in the composition.

On the other hand, for the light source usable for erasing the color from the photopolymerized composition and from the background area in the recorded material (described in detail hereinunder), preferred are those whose wavelength range corresponds to the absorption wavelength range of the photopolymerized composition. Specifically, they are in the broad range of light sources including, for example, mercury lamps, ultra-high-pressure mercury lamps, non-electrode discharge mercury lamps, xenon lamps, tungsten lamps, metal halide lamps, (semiconductor) lasers, LEDs, and fluorescent lamps.

As mentioned hereinabove, the photopolymerizable composition of the invention contains a compound represented by any of formulae (1) to (3) or (4) to (6) that serves as a spectral sensitizing dye, and is therefore highly sensitive to not only UV rays but also to rays in the visible to IR range, thereby ensuring high-sensitivity image formation on recording materials containing it. In addition, since the color erasability of the compounds themselves is good, the dye component from the compounds does not remain in image-recorded materials.

Recording Material:

The recording material of the invention includes a recording layer on a support, in which the recording layer comprises at least a color-forming component A, a color-forming component B having a site that reacts with the color-forming component A to form a color, and the above-mentioned photopolymerizable composition of the invention. The material may have any other layers such as an undercoat layer, an interlayer, a light-absorbing layer, a protective layer and a back coat layer.

The basic constitution of the recording material of the invention is not specifically defined, and may be suitably modified in accordance with the object of the recording material.

One embodiment of the basic structure of the recording material of the invention is described below. In this embodiment, a color-forming component A encapsulated in thermo-responsive microcapsules is included and this example is a photosensitive thermal recording material for positive image formation thereon.

Specifically, when the positive image-forming, photosensitive thermal recording material of this embodiment is imagewise exposed to light, the radical generator in the photopolymerizable composition therein generates radicals in the exposed area. At the same time, the polymerization of the polymerizable compound in the composition is initiated and curing is carried out in that area. As a result, the photopolymerized composition is fixed in the exposed area to form a latent image therein. In that condition, the walls of the microcapsules become impermeable to all substances at room temperature, and the color-forming component A present in the microcapsules is not brought into contact with the color-forming component B which has in the molecule, a site which reacts with the color-forming component A to form a color and which color-forming component B is present outside the microcapsules. At this stage, therefore, no color is formed in the material.

Next, the entire surface of the photosensitive thermal recording material is exposed to heat, and the microcapsules in the material changes so as to be pervious to substances. At this stage, therefore, the color-forming component B in the non-exposed area of the material moves into the microcapsules (and/or the color-forming component A therein moves out of the microcapsules), and the color-forming component A thus reacts with the color-forming component B to form a color only in the non-exposed area of the material. On the other hand, in the exposed area of the material, the photopolymerizable composition is polymerized and cured, and is fixed therein. In this area, therefore, the color-forming component A and the color-forming component B are both immobilized and the two do not contact with each other. That is, no color is formed in the exposed area. After having been thus processed, the entire surface of the material is exposed to light, whereby the region of the material which was not polymerized is polymerized (fixed) and the dye component in the photopolymerized composition in the material is decolored.

Other embodiments of the recording material of the invention are described below, and these are referred to as the first and second embodiments of the material. Any suitable method of image formation thereon is employable.

In the first embodiment of the material, at least one of the polymerizable compound in the photopolymerizable composition is the color-forming component B itself, and the recording layer contains at least the color-forming component A and the photopolymerizable composition of the invention that contains the color-forming component B capable of reacting with the component A to form a color. This embodiment is applied to a positive image-forming, photosensitive thermal recording material having the above-mentioned basic structure. As mentioned hereinabove, the color-forming component B has a site capable of reacting with the color-forming component A to form a color, and has an ethylenic unsaturated bond. When exposed to light imagewisely, polymerization of the color-forming component B is initiated and thereby curing is carried out. The color-forming component B is thus fixed in situ to form a latent image in the exposed area of the material. Accordingly, in the exposed area of the material, the color-forming component B is immobilized and does not contact with the color-forming component A. That is, no color is formed in the exposed area.

In the second embodiment of the recording material of the invention, the recording layer contains at least the color-forming component A, the color-forming component B capable of reacting with the component A to form a color, and the above-mentioned photopolymerizable composition of the invention. In this embodiment, the ethylenic unsaturated bond-having compound (polymerizable compound) in the photopolymerizable composition is a color formation-inhibiting compound which has, in one molecule, a site which inhibits the reaction of the color-forming components A and B (that is, a reaction-inhibiting site).

Hereinunder described is one example of applying the recording material of this embodiment to a negative image-forming, photosensitive thermal recording material that contains the color-forming component A encapsulated in thermo-responsive microcapsules.

In the negative image-forming, photosensitive thermal recording material of this embodiment, the walls of the microcapsules are impermeable to substances at room temperature, as in the material of the above-mentioned first embodiment. In this embodiment, therefore, the color-forming components A and B do not contact with each other, and no color is formed therein. When the material is exposed to light imagewisely, the polymerization of the polymerizable compound in the exposed area of the material is initiated and curing is thereby carried out. The polymerizable compound is fixed in situ to thereby form a latent image in the exposed area. Next, the entire surface of the material is exposed to heat, and the microcapsules in the material change so as to be pervious to substances. At this stage, the color-forming component B moves into the microcapsules (and/or the color-forming component A moves out of the microcapsules), and, at the same time, the polymerizable compound moves into the microcapsules and acts as a color formation-inhibiting compound in the non-exposed area of the material. In the non-exposed area, therefore, the color-forming reaction between the components A and B is inhibited, and no color is formed therein. On the other hand, the polymerizable compound (serving as a color formation-inhibiting compound) in the exposed area of the material has polymerized and is thus fixed therein. In the exposed area, therefore, the polymerizable compound does not participate in the reaction of the color-forming components A and B, and a color is formed only in the exposed area of the material with no effect of the polymerizable compound thereon. After having been thus processed, the entire surface of the recording material is exposed to light, and the dye in the photopolymerized composition therein is decolored.

For the light source for image formation on the recording material of the invention, usable are those mentioned hereinabove for exposing the photopolymerizable composition of the invention to light.

The constituent components of the recording material of the invention are described below.

Photopolymerizable Composition:

The photopolymerizable composition to be included in the recording material of the invention comprises 1) a polymerizable compound having an ethylenic unsaturated bond (polymerizable compound), 2) a decolorizable cyanine-type organic dye (spectral sensitizing dye), and 3) a radical generator that interacts with the dye to form a radical, and optionally contains 4) other components. The composition of the above-mentioned photopolymerizable composition of the invention is used in the recording material of the invention.

When the photopolymerizable composition in a recording material is exposed to light, the spectral sensitizing dye therein absorbs light and interacts with the radical generator also therein. The radical generator thereby generates a radical, by which the polymerizable compound also in the composition is cured through radical polymerization to form an image on the recording material.

The details of the polymerizable compound are described hereinabove. One or more different types of such polymerizable compounds may be in the photopolymerizable composition. As in the above-mentioned first embodiment of the recording material of the invention, at least one of the polymerizable compounds may be the color-forming component B having a site that acts on the color-forming component A to form a color. As will be described hereinunder, this polymerizable compound is a color-forming component having an ethylenic unsaturated bond (polymerizing group) in one molecule.

On the other hand, as in the second embodiment of the recording material also described hereinabove, the polymerizable compound may also function as a color formation-inhibiting compound. A polymerizable compound that has a site that inhibits the reaction between the color-forming components A and B is thus included in one molecule.

The polymerizable compounds are described hereinunder along with the color-forming components (A and B) to be included in the recording layer of the material of the invention.

The amount of the photopolymerizable composition to be included in the recording layer of the material preferably falls between 0.1 and 50 g/m², more preferably between 1 and 30 g/m².

Color-Forming Components:

In the recording material of the invention, the recording layer contains, as color sources, the above-mentioned color-forming components A and B, along with the photopolymerizable composition also mentioned hereinabove. In the first embodiment of the recording material of the invention mentioned above, the recording layer contains the color-forming component A along with the photopolymerizable composition, in which the other color-forming component B, or that is, the polymerizable compound existing in the photopolymerizable composition reacts with the component A to form a color.

Examples of the combination of the color sources, the color-forming component A and color-forming component B which forms an image area are the following (a) to (s). In these examples, the color-forming component A and the color-forming component B are listed in that order.

(a) A combination of an electron-donating dye precursor, and an electron-receiving compound.

(b) A combination of a diazo compound, and a coupling component (hereinafter referred to as "coupler compound").

(c) A combination of a metal salt of an organic acid such as silver behenate or silver stearate, and a reducing agent such as protocatechic acid, spiroindane or hydroquinone.

(d) A combination of an iron salt of a long-chain fatty acid such as ferric stearate or ferric myristate, and a phenol such as tannic acid, gallic acid or ammonium salicylate.

(e) A combination of a heavy metal salt of an organic acid, such as nickel, cobalt, lead, copper, iron, mercury or silver acetate, acetic acid, stearate or palmitate, and an alkali metal or alkaline earth metal sulfide such as calcium sulfide, strontium sulfide or potassium sulfide; or a combination of the above-mentioned heavy metal salt of an organic acid, and an organic chelating agent such as s-diphenylcarbazide or diphenylcarbazone.

(f) A combination of a heavy metal sulfate such as silver, lead, mercury or sodium sulfate, and a sulfur compound such as sodium tetrathionate, sodium thiosulfate or thiourea.

(g) A combination of a ferric salt of a fatty acid such as ferric stearate, and an aromatic polyhydroxy compound such as 3,4-hydroxytetraphenylmethane.

(h) A combination of a metal salt of an organic acid such as silver oxalate or mercury oxalate, and an organic polyhydroxy compound such as polyhydroxyalcohol, glycerin or glycol.

(i) A combination of a ferric salt of a fatty acid such as ferric pelargonate or ferric laurate, and a thiocesylcarbamide or isothiocesylcarbamide derivative.

(j) A combination of a lead salt of an organic acid such as lead caproate, lead pelargonate or lead behenate, and a thiourea derivative such as ethylenethiourea or N-dodecylthiourea.

(k) A combination of a heavy metal salt of a higher fatty acid such as ferric stearate or copper stearate, and a zinc dialkyldithiocarbamate.

(l) A combination forming an oxazine dye, such as a combination of resorcin and a nitroso compound.

(m) A combination of a formazane compound, and a reducing agent and/or a metal salt.

(n) A combination of a protected dye (or leuco dye) precursor, and a deprotecting agent.

(o) A combination of an oxidizable color former, and an oxidizing agent.

(p) A combination of a phthalonitrile and a diiminoisoindoline. (This is a combination forming a phthalocyanine.)

(q) A combination of an isocyanate and a diiminoisoindoline. (This is a combination forming a color pigment.)

(r) A combination of a pigment precursor, and an acid or a base. (This is a combination forming a pigment.)

(s) A combination of an oxidation product precursor of a paraphenylenediamine derivative or a paraaminophenol derivative, and a coupling component (coupler compound).

Of the combinations of two components to serve as color sources, preferred are the combination (a) of an electron-donating dye precursor, and an electron-receiving compound; the combination (b) of a diazo compound and a coupling component (hereinafter referred to as "coupler compound"); the combination (n) of a protected dye (or leuco dye) precursor and a deprotecting agent; and the combination (s) of an oxidation product precursor of a paraphenylenediamine derivative or a paraaminophenol derivative, and a coupling component (coupler compound). Specifically, for the color-forming component A, preferred are electron-donating dye precursors, diazo compounds, dye precursors or oxidation product precursors; and for the color-forming component B, preferred are electron-receiving compounds, coupler compounds or deprotecting agents.

The electron-donating, leuco-dye precursor for the color-forming component A may be any compound known for thermal recording paper or pressure-sensitive recording paper, including, for example, phthalide compounds, fluoran compounds, phenothiazine compounds, indolylphthalide compounds, leucoauramine compounds, rhodamine-lactam compounds, triphenylmethane compounds, triazene compounds, spiropyran compounds, pyridine compounds, pyrazine compounds, and fluorene compounds.

Examples of the phthalide compounds are those described in U.S. Pat. No. (reissued) 23,024, U.S. Pat. Nos. 3,491,111, 3,491,112, 3,491,116, and 3,509,174. Specific examples are 3,3-bis(p-dimethylaminopheny-6-dimethylaminophthalide, 3,3-bis(p-diethylaminophenyl)phthalide, 3,3-bis(2-methyl-1-octylindol-3-yl)phthalide, 3-(4-dipropylamino-2-acetylaminophenyl)-3-(2-methyl-1-octylindol-3-yl)-4-azaphthalide, 3-(4-diethylamino-2-ethoxyphenyl)-3-(2-methyl-1-octylindol-3-yl)phthalide, 3-(4-diethylamino-2-ethoxyphenyl)-3-(2-methyl-1-octylindol-3-yl)-4-azaphthalide, 3-(4-diethylamino-2-methylphenyl)-3-(1-ethyl-2-methylindol-3-yl)-4-azaphthalide, 3,3-bis(4-diethylamino-2-butyloxyphenyl)-4-azaphthalide, and 3-(4-diethylamino-2-butyloxyphenyl)-3-(2-methyl-1-pentylindol-3-yl)-4-azaphthalide.

Examples of the fluoran compounds are those described in U.S. Pat. Nos. 3,624,107, 3,627,787, 3,641,011, 3,462,828, 3,681,390, 3,920,510 and 3,959,571. Specific examples are 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-methyl-6-N-ethyl-N-isobutylaminofluoran, 2-anilino-6-dibutylaminofluoran, and 2-anilino-3-methyl-6-N-methyl-N-tetrahydrofurfurylaminofluoran.

Examples of the thiazine compounds are benzoyl-leucomethylene blue, and p-nitrobenzyl-leucomethylene blue.

Examples of the leucoauramine compounds are 4,4'-bis-dimethylaminobenzhydryl benzyl ether, N-halophenyl-leucoauramine, and N-2,4,5-trichlorophenyl-leucoauramine.

Examples of the rhodamine-lactam compounds are rhodamine-B-anilinolactam, and rhodamine-(p-nitrino) lactam.

Examples of the spiropyran compounds are those described in U.S. Pat. No. 3,971,808. Specific examples are 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphtho-(3-methoxy-benzo) spiropyran, and 3-propyl-spiro-dibenzopyran.

Examples of the pyridine compounds and the pyrazine compounds are those described in U.S. Pat. Nos. 3,775,424, 3,853,869 and 4,246,318.

Examples of the fluorene compounds are those described in Japanese Patent Application No. 61-240989.

For cyan, magenta and yellow color-forming dye precursors, herein usable are those described in U.S. Pat. No. 4,800,149.

For yellow color-forming, electron-donating dye precursors, also usable herein are those described in U.S. Pat. Nos. 4,800,148, 5,126,233, and JP-B 7-88105; and for cyan color-forming, electron-donating dye precursors, also usable herein are those described in JP-A 63-53542.

The electron-donating dye precursor, if used herein, is combined with an electron-receiving compound for the color-forming component B to make the electron-donating dye precursor form a color.

The electron-receiving compound may be any known for thermal recording paper and pressure-sensitive recording paper, including, for example, phenol derivatives, salicylic acid derivatives, metal salts of aromatic carboxylic acids, acidic clay, bentonite, novolak resins, metal-processed novolak resins, and metal complexes. Concretely, they are described in JP-B 40-9309, 45-14039, and JP-A 52-140483, 48-51510, 57-210886, 58-87089, 59-11286, 60-176795, 61-95988.

Of the above, the phenol derivatives include, for example, 2,2-bis(4-hydroxyphenyl)propane, 1,1-bis(3-chloro-4-hydroxyphenyl)cyclohexane, 4-hydroxyphenyl-4'-isopropyloxyphenylsulfone, bis(3-allyl-4-hydroxyphenyl) sulfone, α,α'-bis(4-hydroxyphenyl)-1,4-diisopropylbenzene, and benzyl p-hydroxybenzoate.

The salicylic acid derivatives include, for example, 4-pentadecylsalicylic acid, 3,5-di(α-methylbenzyl)salicylic acid, 3,5-di(tert-octyl)salicylicacid, 5-octadecylsalicylic acid, 5-α-(p-α-methylbenzylphenyl)ethylsalicylic acid, 3-α-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and their salts with zinc, aluminium, calcium or copper.

In the first embodiment of the recording material mentioned above, the color-forming component B serves also as a polymerizable compound having an ethylenic unsaturated bond. Therefore, at least one polymerizable compound is an electron-receiving compound, which has both an electron-recieving group and an ethylenic unsaturated bond (hereinafter referred to as "polymerizing group") in one molecule.

In this case, the compounds for the color-forming component B may be produced, for example, with reference to 3-halo-4-hydroxybenzoic acids described in JP-A 4-226455; methacryloxyethyl esters or acryloxyethyl esters of hydroxyl-having benzoic acids described in JP-A 63-173682; hydroxy-having benzoates with hydroxymethylstyrene described in JP-A 59-83693, 60-141587, 62-99190; hydroxystyrenes described in EP 29323; N-vinylimidazole complexes with zinc halides described in JP-A 62-167077, 62-16708; and electron-receiving compounds described in JP-A 63-317558.

Of the compounds having both an electron-receiving group and a polymerizing group in one molecule, preferred are 3-halo-4-hydroxybenzoates of the following general formula:

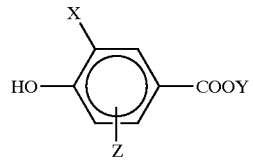

In the formula, X represents a halogen atom, and is preferably a chlorine atom. Y represents a polymerizing ethylene-having monovalent group, and is preferably a vinyl-having aralkyl group, an acryloyloxyalkyl group or a methacryloyloxyalkyl group, more preferably an acryloyloxyalkyl group having from 5 to 11 carbon atoms, or a methacryloyloxyalkyl group having from 6 to 12 carbon atoms. Z represents a hydrogen atom, an alkyl group or an alkoxy group.

The 3-halo-4-hydroxybenzoates include, for example, vinylphenethyl 3-chloro-4-hydroxybenzoate, vinylphenylpropyl 3-chloro-4-hydroxybenzoate, (2-acryloyloxyethyl) 3-chloro-4-hydroxybenzoate, (2-methacryloyloxyethyl) 3-chloro-4-hydroxybenzoate, (2-acryloyloxypropyl) 3-chloro-4-hydroxybenzoate, (2-methacryloyloxypropyl) 3-chloro-4-hydroxybenzoate, (3-acryloyloxypropyl 3-chloro-4-hydroxybenzoate, (3-methacryloyloxypropyl 3-chloro-4-hydroxybenzoate, (4-acryloyloxybutyl) 3-chloro-4-hydroxybenzoate, (4-methacryloyloxybutyl) 3-chloro-4-hydroxybenzoate, (2-acryloyloxyethyl) 3-chloro-4-hydroxybenzoate, (5-acryloyloxypentyl) 3-chloro-4-hydroxybenzoate, (5-methacryloyloxypentyl) 3-chloro-4-hydroxybenzoate, (6-acryloyloxyhexyl) 3-chloro-4-hydroxybenzoate, (6-methacryloyloxyhexyl) 3-chloro-4-hydroxybenzoate, (8-acryloyloxyoctyl) 3-chloro-4-hydroxybenzoate, and (8-methacryloyloxyoctyl) 3-chloro-4-hydroxybenzoate.

Also preferred for use herein are styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethyl orsellinate, β-acryloxyethyl orsellinate, β-methacryloxyethoxyphenol, β-acryloxyethoxyphenol, β-methacryloxyethyl β-resorcylate, β-acryloxyethyl β-resorcylate, hydroxystyrenesulfonic acid N-ethylamide, β-methacryloxypropyl p-hydroxybenzoate, β-acryloxypropyl p-hydroxybenzoate, methacryloxymethylphenol, acryloxymethylphenol, methacrylamidopropanesulfonic acid, acrylamidopropane-sulfonic acid, β-methacryloxyethoxy-dihydroxybenzene, β-acryloxyethoxy-dihydroxybenzene, γstyrenesulfonyloxy-β-methacryloxypropanecarboxylic acid, γ-acryloxypropyl-α-hydroxyethyloxysalicylic acid, β-hydroxyethoxynylphenol, β-methacryloxyethyl p-hydroxycinnamate, β-acryloxyethyl p-hydroxycinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl p-hydroxybenzoate, β-acryloxyethyl p-hydroxybenzoate, β'-methacryloxyethyl β-resorcylate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β- acryloxyethylaminosalicylic acid, N,N'-di-β-methacryloxyethylaminosulfonylsalicylic acid, N,N'-di-β-acryuloxyethylaminosulfonylsalicylic acid, and their metal salts (e.g., zinc salts).

In case where the color-forming component A is an electron-donating dye precursor and the color-forming component B is an electron-receiving compound, the content of the electron-donating dye precursor in the recording layer preferably falls between 0.05 and 5 g/m², more preferably between 0.1 and 3 g/m².

The amount of the electron-receiving compound to be included in the recording layer preferably falls between 0.5 and 20 parts by weight, more preferably between 3 and 10 parts by weight, relative to 1 part by weight of the electron-donating dye precursor therein. If it is smaller than 0.5 parts by weight, the recording layer could not ensure high color density; but if larger than 20 parts by weight, the sensitivity of the recording layer will be low and the coatability of the composition to form the layer will be poor.

On the other hand, for diazo compounds for the color-forming component A, preferred are those of the following formula:

wherein Ar represents an aromatic group; and Y⁻ represents an acid anion.

In the formula, the aromatic group for Ar is, for example, a substituted or unsubstituted aryl group. The substituent for the group includes, for example, an alkyl group, an alkoxy group, an alkylthio group, an aryl group, an aryloxy group, an arylthio group, an acyl group, an alkoxycarbonyl group, a carbamoyl group, a carbamido group, a sulfonyl group, a sulfamoyl group, a sulfonamido group, an ureido group, a halogen atom, an amino group, and a heterocyclic group. These substituents may be further substituted.

The aryl group preferably has from 6 to 30 carbon atoms, including, for example, phenyl, 2-methylphenyl, 2-chlorophenyl, 2-methoxyphenyl, 2-butoxyphenyl, 2-(2-ethylhexyloxy)phenyl, 2-octyloxyphenyl, 3-(2,4-di-t-penthyphenoxyethoxy)phenyl, 4-chlorophenyl, 2,5-dichlorophenyl, 2,4,6-trimethylphenyl, 3-chlorophenyl, 3-methylphenyl, 3-methoxyphenyl, 3-butoxyphenyl, 3-cyanophenyl, 3-(2-ethylhexyloxy)phenyl, 3,4-dichlorophenyl, 3,5-dichlorophenyl, 3,4-dimethoxyphenyl, 3-(dibutylaminocarbonylmethoxy)phenyl, 4-cyanophenyl, 4-methylphenyl, 4-methoxyphenyl, 4-butoxyphenyl, 4-(2-ethylhexyloxy)phenyl, 4-benzylphenyl, 4-aminosulfonylphenyl, 4-N,N-dibutylaminosulfonylphenyl, 4-ethoxycarbonylphenyl, 4-(2-ethylhexylcarbonyl) phenyl, 4-fluorophenyl, 3-acetylphenyl, 2-acetylaminophenyl, 4-(4-chlorophenylthio)phenyl, 4-(4-methylphenyl)thio-2,5-butoxyphenyl, and 4-(N-benzyl-N-methylamino)-2-dodecyloxycabonylphenyl groups.

These groups may be further substituted with any of an alkyloxy group, analkylthio group, a substituted phenyl group, a cyano group, a substituted amino group, a halogen atom, and a heterocyclic group.

Diazo compounds favorably used as the color-forming component A are described, for example, in JP-A 7-276808, paragraphs [0044] to [0049], to which, however, the invention is not limited.

Preferably, the maximum absorption wavelength λ$_{max}$ of the diazo compounds for use herein is at most 450 nm, more preferably from 290 to 440 nm, in view of the effect of the compounds. Also preferably, the diazo compounds have at most 12 carbon atoms, and their solubility in water is at most 1% and in ethyl acetate is at least 5%.

Either singly or combined, one or more diazo compounds may be used for the color-forming component A in accordance with the object of color control.

In case where any of the above-mentioned diazo compounds is used for the color-forming component A, the other color-forming component B to be combined with it is a coupler compound (not having a polymerizing group) or a coupler compound having a polymerizing group.

The coupler compounds couple with a diazo compound in a basic atmosphere and/or a neutral atmosphere to form a color. Depending on the object of color control, two or more such coupler compounds may be combined for use herein.

Examples of the coupler compound having a polymerizing group are active methylene compounds having a methylene group adjacent to the carbonyl group therein, phenol derivatives, naphthol derivatives, azole derivatives, and hetero ring-condensed azole derivatives. These are suitably selected and used herein in accordance with the object of the recording material.

For the coupler skeleton (coupler) in the coupler compound having a polymerizing group, preferred are active methylene compounds having a methylene group adjacent to the carbonyl group therein, phenol derivatives, naphthol derivatives, azole derivatives, and hetero ring-condensed azole derivatives. Specific examples include resorcinol, phloroglucine, 2,3-dihydroxynaphthalane, sodium 2,3-dihydroxynaphthalane-6-sulfonate, 1-hydroxy-2-naphthoic acid morpholinopropylamide, sodium 2-hydroxy-3-naphthalenesulfonate, 2-hydroxy-3-naphthalenesulfonic acid anilide, 2-hydroxy-3-naphthalenesulfonic acid morpholinopropylamide, 2-hydroxy-3-naphthalenesulfonic acid 2-ethylhexyloxypropylamide, 2-hydroxy-3-naphthalenesulfonic acid 2-ethylhexylamide, 5-acetamido-1-naphthol, sodium 1-hydroxy-8-acetamidonaphthalene-3,6-disulfonate, 1-hydroxy-8-acetamidonaphthalene-3,6-disulfonic acid dianilide, 1,5-dihydroxynaphthalene, 2-hydroxy-3-naphthoic acid morpholinopropylamide, 2-hydroxy-3-naphthoicacidoctylamide, 2-hydroxy-3-naphthoic acid anilide, 5,5-dimethyl-1,3-cyclohexanedione, 1,3-cyclopentanedione, 5-(2-n-tetradecyloxypheny)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis (octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2,4-bis (benzoylacetamido) toluene, 1,3-bis (pivaloylacetamidomethyl)benzene, benzoylacetonitrile, thenoylacetonitrile, acetoacetanilide, benzoylacetanilide, pivaloylacetanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one, and 1-(4-n-octyloxyphenyl)-3-tert-butyl-5-aminopyrazole.

For the details of the coupler compounds, referred to are those described in JP-A 4-201483, 7-223367, 7-223368, 7-323660, 5-278608, 5-297024, 6-18669, 6-18670, 7-316280, 9-216468, 9-216469, 9-319025, 10-035113, 10-193801 and 10-264532.

The coupler compound couples with a diazo compound in a basic atmosphere and/or a neutral atmosphere to form a color. If desired, two or more such coupler compounds may be combined for use herein in accordance with the object of color control.

Examples of couplers having a polymerizing group are shown below. However, the invention is not limited to these examples.

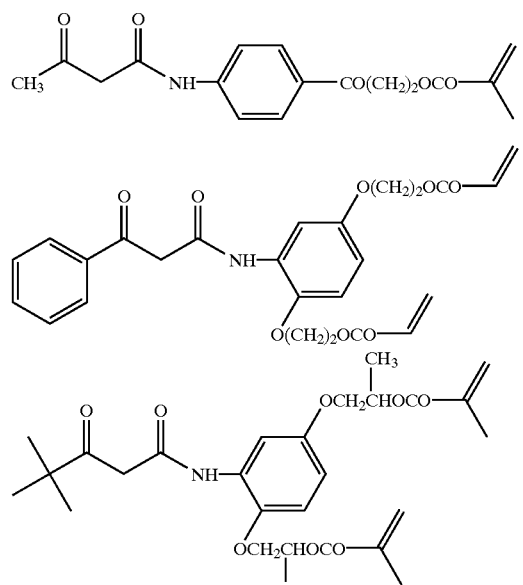
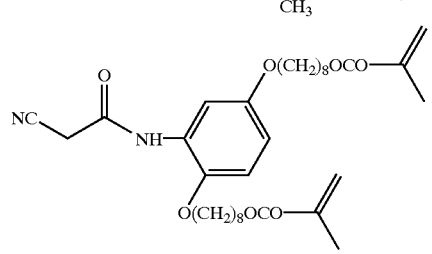
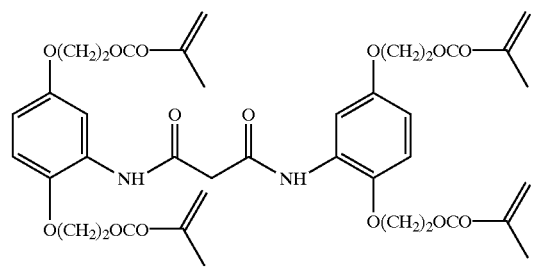
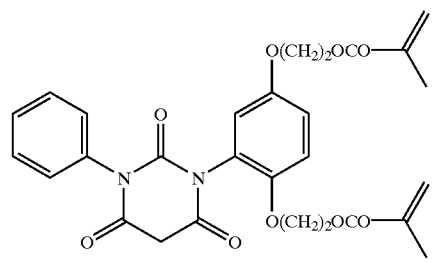
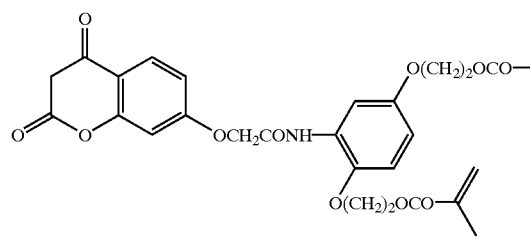
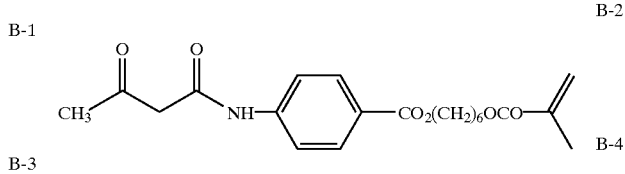
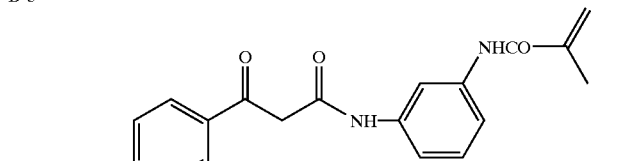
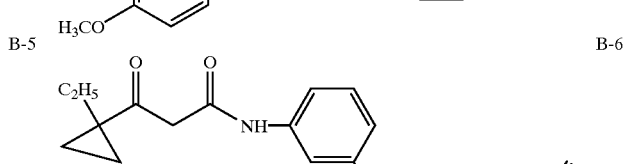
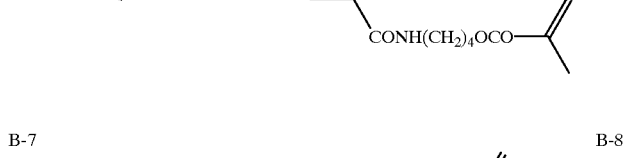
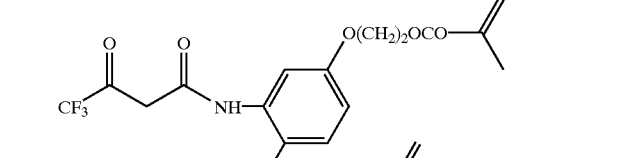
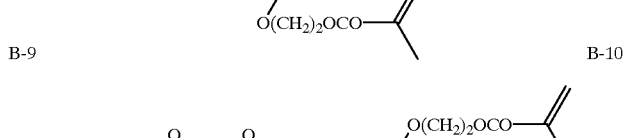
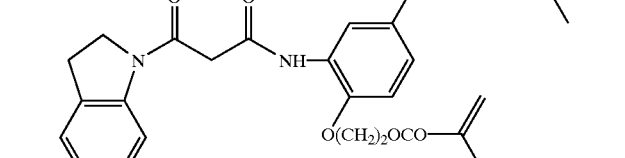
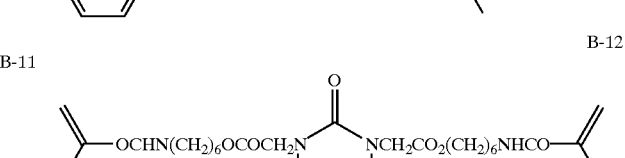
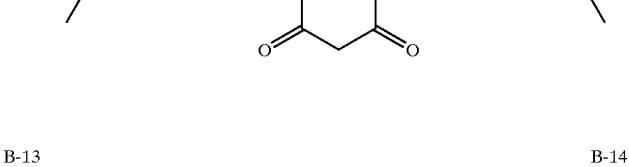
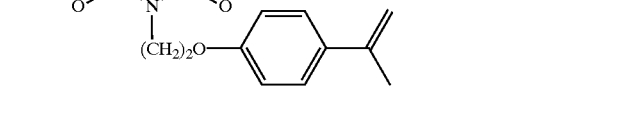

-continued
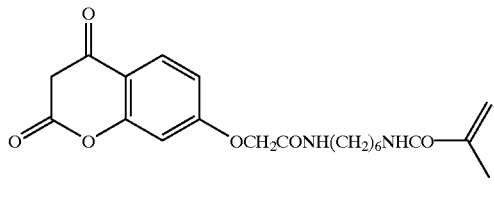 B-15
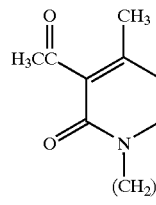 B-16
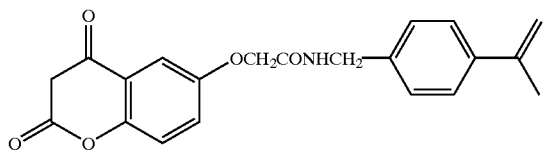 B-17
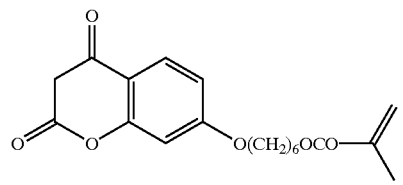 B-18
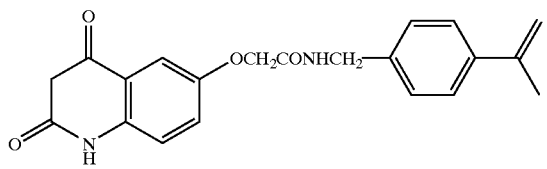 B-19
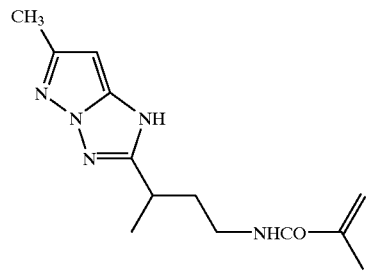 B-20
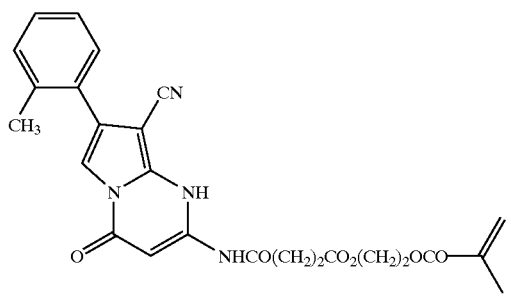 B-21
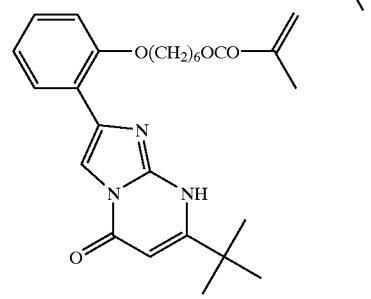 B-22
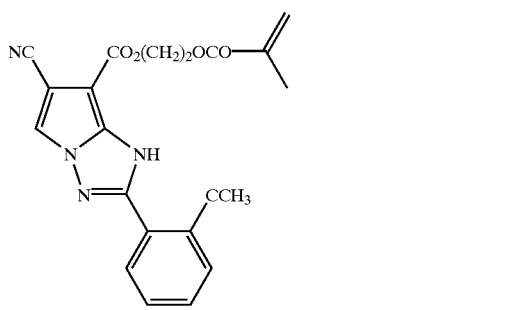 B-23
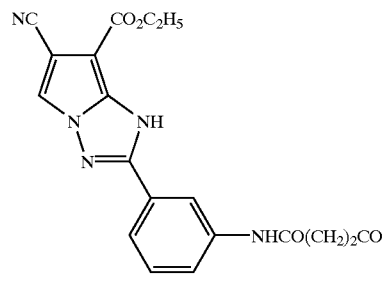 B-24
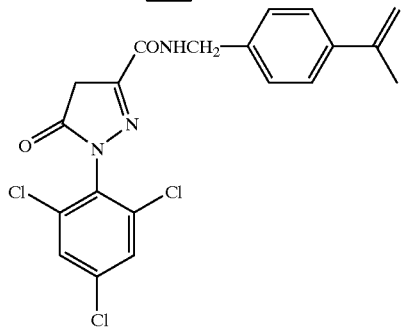 B-25
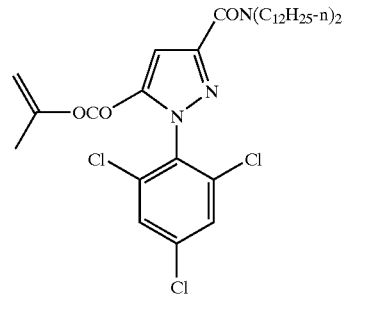 B-26

-continued

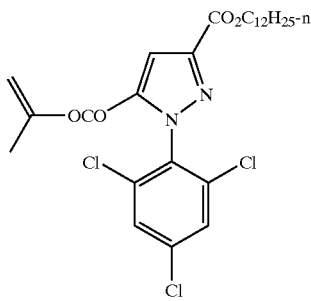
B-27

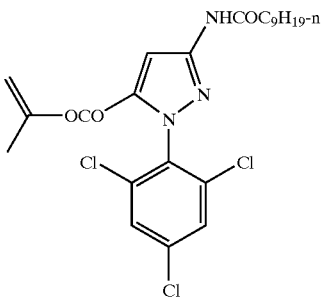
B-28

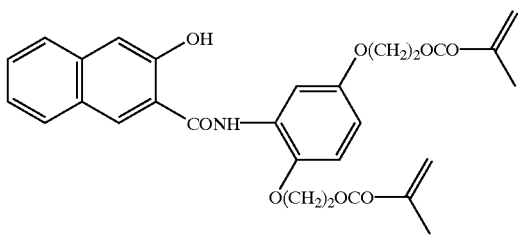
B-29

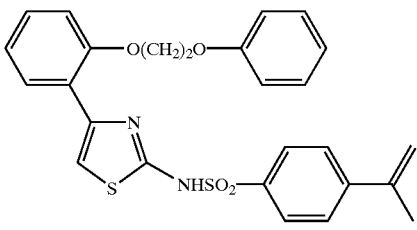
B-30

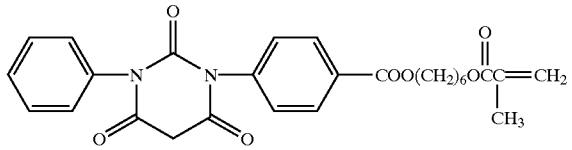
B-31

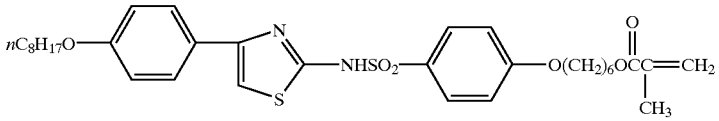
B-32

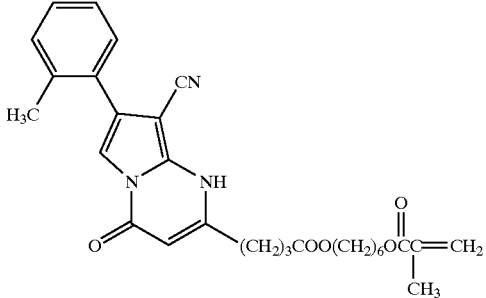
B-33

For the coupler compound not having a polymerizing group, mentioned are the coupler skeleton compounds described hereinabove for the coupler compounds having a polymerizing group.

In case where the color-forming component A is a diazo compound and the color-forming component B is a coupler, the content of the diazo compound in the recording layer preferably falls between 0.02 and 5.0 g/m², more preferably between 0.05 and 3.0 g/m².

If the content of the diazo compound is smaller than 0.02 g/m², the recording material will not have a satisfactory degree of color density; but if larger than 5.0 g/m², the coatability of the coating liquid for the recording layer will be poor.

The amount of the coupler compound to be in the recording layer preferably falls between 0.5 and 20 parts by weight, more preferably between 1 and 10 parts by weight, relative to 1 part by weight of the diazo compound therein. If it is smaller than 0.5 parts by weight, the recording material will not have a satisfactory degree of color density; but if larger than 20 parts by weight, the coatability of the coating liquid for the recording layer will be poor.

Along with the other components and a water-soluble polymer added thereto, the coupler compound for the color-forming component B may be dispersed in solid in a sand mill or the like. However, it may be emulsified along with a suitable emulsifier to form an emulsion. The method of dispersing it in solid or emulsifying it into an emulsion is not particularly limited, and any known methods is employable. The details of the methods are described in JP-A 59-190886, 2-141279 and 7-17145.

For promoting the coupling reaction of the diazo compound and the coupler, preferably used are organic bases such as tertiary amines, piperidines, piperazines, amidines, formamidines, pyridines, guanidines and morpholines.

Specifically, examples of the organic bases include piperazines such as N,N'-bis (3-phenoxy-2-hydroxypropyl)

piperazine, N,N'-bis[3-(p-methylphenoxy)-2-hydroooxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene; morpholines such as N-[3-(β-naphthoxy)-2-hydroxy] propylmorpholine, 1,4-bis[(3-morpholino-2-hydroxy)propyloxy]benzene, 1,3-bis[(3-morpholino-2-hydroxy)propyloxy]benzene; piperidines such as N-(3-phenoxy-2-hydroxypropyl) piperidine, N-dodecylpiperidine; and triphenylguanidine, tricyclohexylguanidine, dicyclohexylphenylguanidine, 2-N-methyl-N-benzylaminoethyl 4-hydroxybenzoate, 2-N,N-di-n-butylaminoethyl 4-hydroxybenzoate, 4-(3-N,N-dibutylaminopropoxy)benzenesulfonamide, 4-(2-N,N-dibutylaminoethoxycarbonyl)phenoxyacetic acid amide.

One or more of these organic bases may be used herein either singly or combined.

These are described in JP-A 57-123086, 60-49991, 60-94381, and Japanese Patent Application Nos. 7-228731, 7-235157, 7-235158.

The organic base for use herein may have a polymerizing group.

In case where such an organic base having a polymerizing group is used in the first embodiment of the recording material of the invention, both the diazo compound and the coupler used as the color-forming component A may be encapsulated in microcapsules, and the organic base having a polymerizing group may serve as the color-forming component B. The combination of the diazo compound and the coupler used as the color-forming component A to be included in microcapsules should be so selected that the diazo compound and the coupler require a base for the coupling reaction for forming a color.

In the first embodiment of the material, a diazo compound may be used for the color-forming component A and a combination of a coupler having a polymerizing group and an organic base also having a polymerizing group may be for the color-forming component B.

The amount of the organic base to be included in the recording layer is not specifically defined, but preferably falls between 1 and 30 mols per mol of the diazo compound in the layer.

For promoting the color-forming reaction, a color-forming reaction promoter may be added to the recording layer. The color-forming reaction promoter includes, for example, phenol derivatives, naphthol derivatives, alkoxy-substituted benzenes, alkoxy-substituted naphthalenes, hydroxy compounds, carboxylic acid amide compounds, and sulfonamide compounds.

Polymerizable compounds usable in the second embodiment of the recording material of the invention are described below.

The second embodiment of the material may contain a polymerizable compound in its recording layer. Specifically, it may contain, along with the color-forming component A and the color-forming component B which reacts with the component A to form a color, a color formation-inhibiting compound which has, in one molecule, both a site which inhibits the reaction of the color-forming components A and B, and an ethylenic unsaturated bond (this will be hereinafter referred to as "polymerizable, color formation-inhibiting compound").

In the case where the color-forming component A in this embodiment is an electron-donating dye precursor and the color-forming component B is an electron-receiving compound not having a polymerizing group, the polymerizable, color formation-inhibiting compound therein is preferably a photopolymerizable monomer having, in one molecule, both a site which inhibits the reaction of the electron-donating dye precursor and the electron-receiving compound, and at least one vinyl group (this will be hereinafter referred to as "photopolymerizable monomer $D_1$").

Specific examples of the photopolymerizable monomer $D_1$ include acrylic acid and its salts, acrylates, acrylamides, methacrylic acid and its salts, methacrylates, methacrylamides, maleic anhydride, maleates, itaconic acid, itaconates, styrenes, vinyl ethers, vinyl esters, N-vinyl-heterocyclic compounds, allyl ethers, and allyl esters.

Of those, especially preferred for use herein are compounds having two or more vinyl groups in one molecule. Concretely, they are acrylates and methacrylates with polyalcohols such as trimethylolpropane or pentaerythritol; acrylates and methacrylates with polyphenols or bisphenols such as resorcinol, pyrogallol or phloroglucinol; acrylate or methacrylate-terminated epoxy resins; and acrylate or methacrylate-terminated polyesters.

Of the above, especially preferred are ethylene glycol diacrylate, ethylene glycol dimethacrylate, trimethylolpropane triacrylate, pentaerythritol tetraacrylate, dipentaerythritol hydroxypentaacrylate, hexanediol 1,6-dimethacrylate, and diethylene glycol dimethacrylate.

The molecular weight of the photopolymerizable monomer $D_1$ preferably falls between about 100 and about 5000, more preferably about 300 and about 2000.

In a case where the polymerizable, color formation-inhibiting compound to be used is the photopolymerizable monomer $D_1$, its amount preferably falls between 0.1 and 10 parts by weight, more preferably between 0.5 and 5 parts by weight, relative to 1 part by weight of the electron-donating compound to be combined with the coupler compound not having a polymerizing group. If the amount is smaller than 0.1 parts by weight, a latent image often cannot be formed in the step of exposing the material; but if larger than 10 parts by weight, the color density of the processed material will be low.

In a case where the color-forming component A is a diazo compound and the color-forming component B is a coupler compound not having a polymerizing group, the polymerizable, color formation-inhibiting compound to be combined with them is preferably a photopolymerizable monomer having, in one molecule, both an acidic group that inhibits the coupling reaction of the diazo compound and the coupler compound, and at least one vinyl group (this will be hereinafter referred to as "photopolymerizable monomer $D_2$").

For the photopolymerizable monomer $D_2$, for example, preferred are styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethyl orsellinate, β-acryloxyethyl orsellinate, β-methacryloxyethoxyphenol, β-acryloxyethoxyphenol, β-methacryloxyethyl β-resorcylate, β-acryloxyethyl β-resorcylate, hydroxystyrenesulfonic acid N-ethylamide, β-methacryloxypropyl p-hydroxybenzoate, β-acryloxypropyl p-hydroxybenzoate, methacryloxymethylphenol, acryloxymethylphenol, methacrylamidopropanesulfonic acid, acrylamidopropanesulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, β-hydroxyethoxynylphenol, β-methacryloxyethyl p-hydroxycinnamate, β-acryloxyethyl p-hydroxycinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl p-hydroxybenzoate, β-acryloxyethyl p-hydroxybenzoate, β'-methacryloxyethyl β-resorcylate, β-methacryloxyethyloxycarbonylhydroxybenzoic acid, β-acryloxyethyloxycarbonylhydroxybenzoic acid, N,N-di-βmethacryloxyethylaminosalicylic acid, N,N-di-β-acryloxyethylaminosalicylic acid, N,N-di-β-methacryloxyethylaminosulfonylsalicylic acid, and N,N-di-β-acryloxyethylaminosulfonylsalicylic acid.

In a case where the polymerizable, color formation-inhibiting compound to be used is the photopolymerizable monomer $D_2$, its amount preferably falls between 0.1 and 10 parts by weight, more preferably between 0.5 and 5 parts by weight, relative to 1 part by weight of the coupler compound not having a polymerizing group to be combined with it. If the amount is smaller than 0.1 parts by weight, a latent image often cannot be formed in the step of exposing the material; but if larger than 10 parts by weight, the color density of the processed material will be low.

Microcapsules:

In the recording layer in the recording material of the invention, it is desirable that the color-forming component A is encapsulated in microcapsules.

For its encapsulation, employable is any known method. For example, employable is any of a method of coacervation of a hydrophilic wall-forming material as in U.S. Pat. Nos. 2,800,457 and 2,800,458; a method of interfacial polymerization as in U.S. Pat. No. 3,287,154, BP 990,443, JP-B 38-19574, 42-446, 42-771; a method of polymer precipitation as in U.S. Pat. Nos. 3,418,250 and 3,660,304; a method of using a wall-forming material of isocyanate polyol as in U.S. Pat. No. 3,796,669; a method of using a wall-forming material of isocyanate as in U.S. Pat. No. 3,914,511; a method of using a wall-forming material of urea-formaldehyde or urea-formaldehyde-resorcinol as in U.S. Pat. Nos. 4,001,140, 4,087,376, 4,089,802; a method of using a wall-forming material of melamine-formaldehyde resin or hydroxypropyl cellulose as in U.S. Pat. No. 4,025,455; a method of in-situ monomer polymerization as in JP-B 36-9168 and JP-A 51-9079; a method of electrolytic dispersion with cooling as in BP 952,807 and 965,074; and a method of spray-drying as in U.S. Pat. No. 3,111,407 and BP 930,422.

Though not limited thereto, one preferred example of encapsulation in microcapsules for producing the recording material of the invention is interfacial polymerization, which is as follows: The color-forming component is dissolved or dispersed in a hydrophobic organic solvent to prepare an oil phase that is to be the core of each microcapsule; the oil phase is mixed with an aqueous phase of a solution of a water-soluble polymer; the resulting mixture is emulsified and dispersed in a homogenizer or the like; and then this is heated to cause polymer formation in the interface of the oil drops, thereby forming a polymer microcapsule wall around each oil drop. According to the method, microcapsules having a uniform size can be formed within a short period of time, and the recording material containing them has good raw-stock storability.

The polymer-forming reactant is added to the inside and/or outside of oil drops. Specific examples of the polymer substance are polyurethanes, polyureas, polyamides, polyesters, polycarbonates, urea-formaldehyde resins, melamine resins, polystyrenes, styrene-methacrylate copolymers, and styrene-acrylate copolymers. Of those, preferred are polyurethanes, polyureas, polyamides, polyesters, and polycarbonates; and more preferred are polyurethanes and polyureas. Two or more such polymer substances may be used combined.

The water-soluble polymer includes, for example, gelatin, polyvinyl pyrrolidone, and polyvinyl alcohol. For example, microcapsule walls of polyurethane are formed as follows: A polyisocyanate and a second substance that reacts with it to form microcapsule walls (for example, polyol, polyamine) are mixed in an aqueous, water-soluble polymer solution (aqueous phase) or in an oily medium to be encapsulated (oil phase), and these are emulsified and dispersed, and then heated to cause polymer formation at the interface of the oil drops to thereby form microcapsule walls.

The polyisocyanate and its reactants, polyol and polyamine may be those described in, for example, U.S. Pat. Nos. 3,281,383, 3,773,695, 3,793,268; JP-B 48-40347, 49-24159; and JP-A 48-80191, 48-84086.

In its microcapsules, the color-forming component A encapsulated may be in any form of solution or solid therein.

In a case where the color-forming component A is in the solution form in microcapsules, for example, the component A may be encapsulated after being dissolved in a hydrophobic organic solvent. In this case, the amount of the organic solvent to be used preferably falls between 1 and 500 parts by weight relative to 100 parts by weight of the color-forming component A.

For the hydrophobic organic solvent, generally used are phosphates, phthalates, acrylates, methacrylates, other carboxylates, fatty acid amides, alkylated biphenyls, alkylated terphenyls, chloroparaffins, alkylated naphthalenes, diallylethane, compounds that are solid at room temperature, oligomer oils, and polymer oils. Specifically, they are described, for example, in JP-A59-178451 to 59-178455, 59-178457, 60-242094, 63-85633, 6-194825, 7-13310, 7-13311, 9-106039, and Japanese Patent Application No. 62-75409.

In a case where the solubility in the organic solvent of the color-forming component A to be encapsulated is low, a low-boiling-point solvent in which the solubility of the component A to be encapsulated is high may be used as a co-solvent. The low-boiling-point solvent includes, for example, ethyl acetate, propyl acetate, isopropyl acetate, butyl acetate, and methylene chloride.

On the other hand, for the aqueous phase, used is an aqueous solution of a water-soluble polymer. To this is added the oil phase, and the resulting mixture is emulsified and dispersed in a homogenizer or the like. In the process, the water-soluble polymer acts as a dispersant that facilitates uniform dispersion and stabilizes the resulting aqueous emulsion. For ensuring more uniform emulsification and dispersion and for further stabilizing the resulting emulsion, a surfactant may be added to at least one of the oil phase and the aqueous phase. The surfactant may be any known one for emulsification. The amount of the surfactant, if added, preferably falls between 0.1 and 5% by weight, more preferably between 0.5 and 2% by weight of the oil phase.

The mean particle size of the microcapsules of the color-forming component A is preferably at most 20 $\mu$m, more preferably at most 5 $\mu$m for high resolution in image formation. However, if the microcapsules formed are too small, the surface area by which a particular amount of solid is to be encapsulated will increase, and a large amount of the wall material will be needed. Therefore, it is desirable that the mean particle size of the microcapsules is at least 0.1 $\mu$m.

The photopolymerizable composition of the invention is not limited to the recording material mentioned hereinabove and is also usable in other various fields of, for example, inks, color filters, holograms, proofs, sealants, adhesives, lithographic prints, resin relief prints, photoresists, etc. Depending on its applications, therefore, the composition may contain various other components. In a case where the composition is not used in a recording material, the polymerizable compound 3) does not have to function as the color-forming component B and the color formation-inhibiting compound as in the above and any polymerizable compound having an ethylenic unsaturated bond may be used with no specific limitation.

In a case where the recording material of the invention is for multi-color image formation thereon, different monochromatic recording layers are formed on a support. In the multi-color image recording material of this type, each monochromatic recording layer contains a color-forming component A which forms its own color (this may be in microcapsules), a color-forming component B having, in the molecule, a site that reacts with the component A to form the color for that particular layer (this may have a polymerizing group), and a photopolymerizable composition sensitive to light specific thereto and capable of forming a latent image through exposure to the light. Specifically, in the multi-color image recording material of this type, different spectral sensitizing dyes having different absorption wavelength ranges are added to different photopolymerizable compositions that are to be in different recording layers. In this, therefore, the different photopolymerizable compositions are sensitive to different wavelength ranges individually intrinsic to each. In the multi-color image recording material, an interlayer may be provided between the neighboring monochromatic recording layers, if desired.

The recording layers of the multi-layer recording material for multi-color image formation of the invention may be formed, for example, as follows:

A first recording layer that contains microcapsules of an yellow color-forming component $A^Y$, a color-forming component $B^Y$ to react with the component $A^Y$ to form an yellow color, and a photopolymerizable composition sensitive to light having a center wavelength $\lambda_1$ to form a latent image is formed on a support; then a second recording layer that contains microcapsules of a magenta color-forming component $A^M$, a color-forming component $B^M$ to react with the component $A^M$ to form a magenta color, and a photopolymerizable composition sensitive to light having a center wavelength $\lambda_2$ to form a latent image is formed on that first recording layer; and then a third recording layer that contains microcapsules of a cyan color-forming component $A^C$, a color-forming component $B^C$ to react with the component $A^C$ to form a cyan color, and a photopolymerizable composition sensitive to light having a center wavelength $\lambda_3$ to form a latent image is formed on that second recording layer to thereby complete a multi-layered recording layer α having a laminate structure thus formed on the support; and optionally an interlayer is provided between the adjacent layers of the multi-layered recording layer α to form a recording layer β.

The process of multi-color image formation on the multi-layered recording material is described hereinafter. The material is imagewise exposed to light from different sources that individually emit light of different wavelengths, whereby different latent images are selectively formed in the recording layers having different absorption wavelengths corresponding to the different light sources applied thereto. All the recording layers of the material are highly sensitive to the light selectively corresponding thereto, and therefore a sharp multi-color image is formed on the material through the process. After being thus processed, the entire surface of the material is then exposed to light to thereby decolor the spectral sensitizing dyes and other components of the photopolymerizable compositions still remaining in the layers that constitute the background area of the material. Through the process, therefore, a high-contrast multi-color image of high quality is finally formed on the material.

Support:

For the support, herein usable is any type of paper support generally used for conventional pressure-sensitive or thermal copying paper or dry or wet diazo copying paper. Specifically, the support usable herein includes, for example, acid paper, neutral paper, coated paper, plastic film-laminated paper, synthetic paper, and plastic films.

The recording material of the invention is favorable, for example, for fabrication of lithographic prints, resin relief prints, resists or photomasks for printed circuit boards, black-and-white or color transfer sheets, and other color sheets. In one example, the recording material of the invention is used in fabricating photosensitive thermal color sheets, as follows: Either individually or combined, the components are dissolved or dispersed in suitable solvents to prepare solutions or dispersions, and these are mixed to prepare a coating liquid. The coating liquid is then applied onto a support such as paper or a plastic film, and then dried. In another example, predetermined components may be encapsulated into microcapsules, as follows: A dispersion of microcapsules of any of the components is prepared. Also, a dispersion or solution of the other components is prepared, and this is mixed with the microcapsule dispersion to prepare a coating liquid. In preparing the coating liquids, the components may be dispersed by the use of a homogenizer or the like in order to form good dispersions.

For coating the support and drying it, employable is any known method.

For recording an image thereon, the recording material of the invention is exposed to light to form a latent image while it is being heated, or after it is exposed, it is heated and developed.

For heating the material for thermal development, employable is any known method. In general, the heating temperature preferably falls between 80 and 200° C., more preferably between 85 and 130° C. The heating time preferably falls between 1 second and 5 minutes, more preferably between 3 seconds and 1 minute.

After being thermally developed in that manner, the entire surface of the material is preferably exposed to light to polymerize the unpolymerized region of the material to thereby fix the image on the material. In this step, the spectral sensitizing dyes and other components that remain in the recording layers and lower the whiteness of the background area of the material are decolored, decomposed or deactivated.

As compared with conventional ones, the recording material of the invention can be processed within a short period of time to form and fix an image thereon, and its background area is prevented from being colored, therefore having an increased degree of whiteness.

The process of image formation on the recording material of the invention may comprise an additional step of uniformly preheating the entire surface of the material at a predetermined temperature lower than the temperature for color formation therein. This is effective for further increasing the sensitivity of the material. The recording process for the recording material of the invention is not limited to that mentioned above, and may be processed using any other recording processes known in the art.

As described hereinabove, the recording material of the invention can be processed in a completely dry system which does not require developer and does not produce waste, to form an image thereon, in which the material is highly sensitive to not only UV rays but also rays in the visible to IR range. The non-image area (background area) of the processed material is well decolored, and a sharp and high-contrast, black-and-white or color image can be recorded on the material.

EXAMPLES

Examples of the invention are described below, which, however, are not intended to restrict the scope of the invention. In the following Examples, "%" and "parts" are all by weight unless otherwise specifically indicated.

Examples 1 to 10

As shown in Table 1 below, the photopolymerizable compositions using the organic dyes (compounds of formulae (1) to (6) above, i.e., spectral sensitizing dyes) and organoboron compounds and containing the components listed below.

| [Constitution of Photopolymerizable Composition] | |
|---|---|
| Pentaerythritol tetraacrylate | 1.41 g |
| Benzyl methacrylate/methacrylic acid (copolymer, 73/27 by mol) | 1.29 g |
| Methyl ethyl ketone | 12 g |
| Propylene glycol monomethyl ether acetate | 8.62 g |
| Organic dye (compound mentioned above, see Table 1) | $1 \times 10^{-4}$ mols |
| Organoboron compound mentioned below (see Table 1) | $6 \times 10^{-4}$ mols |
| Methanol | 6 g |

The structures of the borates (1) and (2) (organoboron compounds) in Tables 1 and 2 are shown below.

Borate (1)

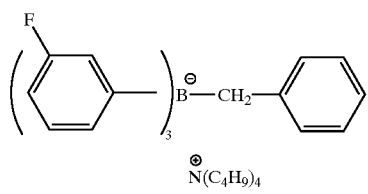

Borate (2)

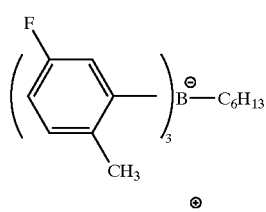

Each photopolymerizable composition thus prepared was applied onto a polyethylene terephthalate film which was 100 μm thick, and dried at 100° C. for 5 minutes to form thereon a layer having a thickness of 2 μm. Next, a coating liquid (1) for protective layer was applied thereon, and dried at 100° C. for 2 minutes to form a protective layer having a thickness of 1 μm. Photosensitive materials (1) to (10) of the invention were thus fabricated.

| [Composition of Coating Liquid (1) for Protective Layer] | |
|---|---|
| Water | 98 g |
| Polyvinyl alcohol | 1.7 g |
| Hydroxypropylmethyl cellulose | 1.7 g |
| polyvinyl pyrrolidone | 8.7 g |

Comparative Examples 1 and 2

Photosensitive materials (11) and (12) were fabricated in the same manner as in Example 1 except that the organic dye (compound No. 2) used in Example 1 was replaced by any of organic dye d-1 or d-2 (spectral sensitizing dye) shown below, as shown in Table 1.

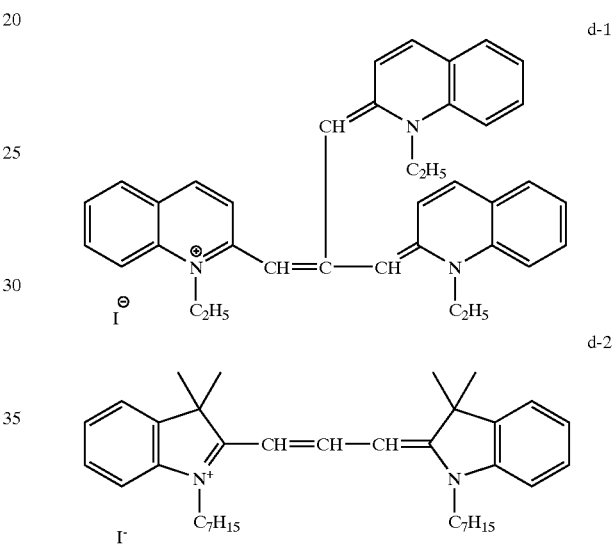

Image Formation and Evaluation:

Using a vacuum printing frame, the photosensitive materials (1) to (10) of the invention and the photosensitive materials (11) and (12) of Comparative Examples were exposed to light. They were exposed to light from a 500 W xenon lamp (from Ushio) for 10 seconds, through a step wedge (Fuji Stepguide P™ manufactured by Fuji Photo Film, having 1st to 15th density step wedges with a density difference of 0.15 therebetween) and through a sharp cut filter (SC38 Filter™ manufactured by Fuji Photo Film—which cuts out wavelengths of 380 nm and shorter). After being thus exposed, they were developed with a developer having a composition as shown below.

| [Composition of Developer] | |
|---|---|
| Anhydrous sodium carbonate | 10 g |
| Butyl cellosolve | 5 g |
| Water | 1 liter |

The amount of light which reached the region of each sample through the step wedges of higher density adjacent thereto is small. Therefore, the photopolymerizable composition in that region which received a smaller amount of light through the step wedges of higher density was eluted into the developer, and the polyethylene terephthalate (PET) surface was exposed in that region. The regions where the photopolymerizable composition was completely eluted and in which the PET surface was exposed were examined for the photosensitive materials of the Examples and the Comparative Examples. The number of the step wedge adjacent to the region which received the largest amount of light was identified. This is the number of the cleared step wedge of each sample.

A higher number of the clear step wedge corresponds to higher sensitivity of the photosensitive material tested. The results are shown in Table 1 below.

The photo sensitive materials (1) to (10) of the invention the photosensitive materials (11) and (12) of Comparative Examples were exposed to a fluorescent lamp (30000 luxes) for 10 minutes, and the yellow, magenta and cyan density of each sample was measured with a Macbeth transmission densitometer. The better the decolorization of the organic dye upon exposure treatment, the lower was the fog density in the background area thereof. The results are shown in Table 1 below.

In Table 1, the number (No.) in the column of organic corresponds to the number of the compounds of formulae (1) to (6) above. The same applies for Table 2.

phthalated gelatin and 1.4 g of 10% sodium dodecylbenzenesulfonate, and emulsified and dispersed at 20° C. to prepare an emulsion. To the resulting emulsion, added were 14 g of water and 72 g of aqueous 2.9% tetraethylenepentamine, and this was heated at 60° C. while being stirred. After 2 hours, obtained was a suspension of microcapsules having a mean particle size of 0.5 µm, in which the electron-donating leuco-dye (1) formed a core of each microcapsule.

Electron-Donating Leuco-Dye (1):

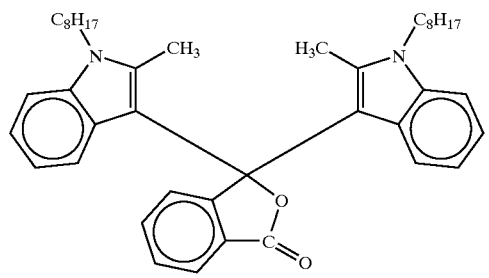

TABLE 1

| | Photosensitive Material No. | Organic Dye (*1) | Organoboron Compound | Maximum Absorption Wavelength (nm) | Number of Cleared Step Wedge |
|---|---|---|---|---|---|
| Example 1 | (1) | No. 1 | borate (1) | 570 | 9 |
| Example 2 | (2) | No. 3 | borate (1) | 570 | 9 |
| Example 3 | (3) | No. 10 | borate (1) | 500 | 9 |
| Example 4 | (4) | No. 21 | borate (1) | 557 | 10 |
| Example 5 | (5) | No. 22 | borate (2) | 557 | 11 |
| Example 6 | (6) | No. 23 | borate (2) | 560 | 11 |
| Example 7 | (7) | No. 24 | borate (2) | 562 | 11 |
| Example 8 | (8) | No. 25 | borate (2) | 560 | 11 |
| Example 9 | (9) | No. 31 | borate (2) | 640 | 8 |
| Example 10 | (10) | No. 26 | borate (2) | 525 | 8 |
| Comp. Ex. 1 | (11) | d-1 | borate (1) | 670 | 5 |
| Comp. Ex. 2 | (12) | d-2 | borate (1) | 560 | 4 |

(*1) No. of organic dye indicates No. of the exemplified compounds.

From the data in Table 1 above, it is understood that the photosensitive materials (1) to (10) of the invention, in which the organic dye is any of the compounds of formulae (1) to (6), have high sensitivity.

However, the sensitivity of the photosensitive materials (11) and (12) of Comparative Examples is low, as they do not contain the organic dye specifically defined in the invention.

Example 11

Preparation of Electron-Donating Leuco-Dye Microcapsule Suspension (1-a) Preparation of Microcapsule Suspension of Electron-Donating Leuco-Dye (1):

8.9 g of an electron-donating leuco dye (1) below was dissolved in 16.9 g of ethyl acetate, to which was added a capsule wall-forming, polyurethane resin material (a mixture of 20 g of Takenate D-110N™ manufactured by Takeda Chemical Industry and 2 g of Millionate MR200™ manufactured by Nippon Polyurethane Industry). The resulting solution was added to a liquid mixture of 42 g of 8%

Preparation of Photopolymerizable Composition Emulsion (2-a) Preparation of Photopolymerizable Composition Emulsion:

0.05 g of an organic dye (Compound No. 3 shown above-see Table 2 below), 0.3 g of an organoboron compound (borate (1) shown above), 0.05 g of a polymerization promoter (1) shown below, and 4.2 g of a polymerizable, electron-receiving compound (1) mentioned below were dissolved in 5.3 g of isopropyl acetate while stirring.

Polymerization Promoter (1):

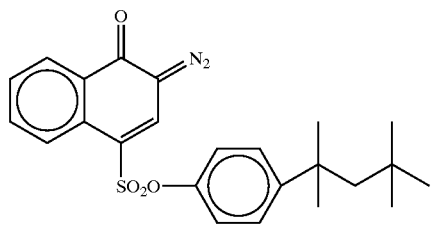

-continued

Polymerizing, Electron-Receiving Compound (1):

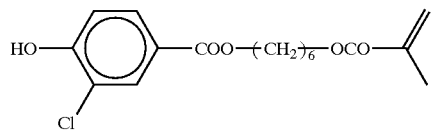

The resulting solution was added to a mixture of 13 g of aqueous 8% gelatin, 0.8 g of aqueous 2% surfactant (1) shown below and 0.8 g of aqueous 2% surfactant (2) shown below, and emulsified in a homogenizer (manufactured by Nippon Seiki) for 5 minutes at 10000 rpm to prepare a photopolymerizable composition emulsion.

Surfactant (1):

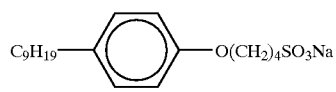

Surfactant (2):

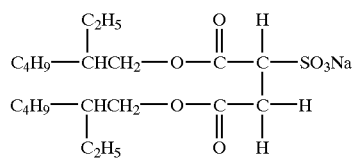

Preparation of Coating Liquid for Recording Layer
(3-a) Preparation of Coating Liquid for Recording Layer:
4 g of the microcapsule suspension of electron-donating leuco-dye (1) and 12 g of the photopolymerizable composition emulsion were mixed along with 12 g of aqueous 15% gelatin to prepare a coating liquid for recording layer.

Preparation of Coating Liquid for Protective Layer
(4-a) Preparation of Coating Liquid (2) for Protective Layer:
4.5 g of aqueous 10% gelatin, 4.5 g of distilled water, 0.5 g of aqueous 2% surfactant (3) shown below, 0.3 g of aqueous 2% surfactant (4) shown below, 0.5 g of aqueous 2% hardener (1) shown below, and Sairoid 72 (manufactured by Fuji-Devison Chemical) to give a dry coat amount of 50 mg/m², and 1 g of colloidal silica, Snowtex N (manufactured by Nissan Chemical Industries) were mixed to prepare a coating liquid (2) for protective layer.

Surfactant (3):

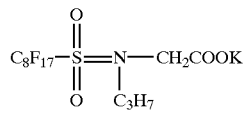

Surfactant (4):

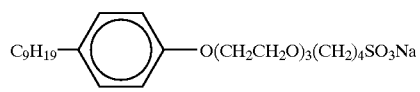

Hardener (1):

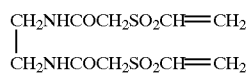

Support

A white pigment-containing, 100 µm-thick white polyester film (Lumilar E68L™ manufactured by Toray) was prepared for a support. Using a coating bar, the coating liquid for recording layer was applied onto the support and dried at 30° C. for 10 minutes to form thereon a recording layer having a dry weight of 6 g/m². Also using a coating bar, the coating liquid (2) for protective layer was applied onto the recording layer, and dried at 30° C. for 10 minutes to form thereon a protective layer having a dry weight of 2 g/m². Thus was fabricated a photosensitive thermal recording material (a) of the invention.

Examples 12 to 17

Photosensitive thermal recording materials (b) to (g) of the invention were fabricated in the same manner as in Example 11 except that the organic dye (Compound No. 3) and the organoboron compound (borate (1) ) used in Example 11 were replaced by one of the organic dyes mentioned above (compounds of formulae (1) to (3), spectral sensitizing dyes) and organoboron compounds as in Table 2 below.

Comparative Examples 3 and 4

Photosensitive thermal recording materials (h) and (i) were fabricated in the same manner as in Example 11 except that the organic dye (Compound No. 3) used in Example 11 was replaced by one of the organic dyes d-1 or d-2 mentioned above, as in Table 2 below.

Image Formation and Evaluation:

Using a vacuum printing frame, the photosensitive thermal recording materials (a) to (g) of the invention and the photosensitive thermal recording materials (h) and (i) of Comparative Examples were exposed to light. Specifically, they were exposed to light from a 500 W xenon lamp for 30 seconds, through a step wedge and a filter SC38 to form a latent image thereon. After being thus exposed, they were heated on a hot plate at 125° C. for 15 seconds. The electron-donating leuco-dye (1) thus reacted with the polymerizing, electron-receiving compound (1) to form a magenta color in the non-exposed area. In the exposed area, however, the color density was low or no color was formed. The region with no color formation therein was analyzed, and the number of the step wedge adjacent to the region having received the smallest amount of light was identified. This is the number of the clear step wedges of each sample. The higher number of the clear step wedges, the higher the sensitivity of the photosensitive material tested.

The results are shown in Table 2 below. The samples having low sensitivity and therefore having formed a color through every step wedge are referred to as samples of "solid" color formation.

In addition, the photosensitive materials were exposed to a fluorescent lamp (30000 luxes) for 10 minutes, and the density of the background area around the yellow, magenta and cyan colors of each sample was measured with a Macbeth transmission densitometer. The better the decolorization of the organic dye upon exposure treatment, the better was the fog density in the background area thereof. The results are shown in Table 2 below.

TABLE 2

| Photosensitive Thermal Recording Material No. | Organic Dye (*1) | Organoboron Compound | Maximum Absorption Wavelength (nm) | Number of Cleared Step Wedge | Fog Density After Exposure | | |
|---|---|---|---|---|---|---|---|
| | | | | | Yellow | Magenta | Cyan |
| Example 11 | (a) | No. 3 | borate (1) | 570 | 9 | 0.06 | 0.10 | 0.06 |
| Example 12 | (b) | No. 6 | borate (1) | 571 | 9 | 0.05 | 0.09 | 0.06 |
| Example 13 | (c) | No. 21 | borate (1) | 557 | 10 | 0.05 | 0.11 | 0.07 |
| Example 14 | (d) | No. 22 | borate (2) | 557 | 11 | 0.05 | 0.11 | 0.07 |
| Example 15 | (e) | No. 23 | borate (2) | 560 | 12 | 0.05 | 0.10 | 0.06 |
| Example 16 | (f) | No. 24 | borate (2) | 562 | 12 | 0.06 | 0.09 | 0.06 |
| Example 17 | (g) | No. 24 | borate (1) | 562 | 11 | 0.06 | 0.09 | 0.06 |
| Comp. Ex. 3 | (h) | d-1 | borate (1) | 670 | 5 | 0.07 | 0.12 | 0.41 |
| Comp. Ex. 4 | (i) | d-2 | borate (1) | 560 | 4 | 0.07 | 0.44 | 0.05 |

(*1) No. of organic dye indicates No. of exemplified compounds.

From the data in Table 2 above, it is understood that the photosensitive thermal recording materials (a) to (g) of the invention, in which the organic dye is any of the compounds of formulae (1) to (3), all have high sensitivity and have good color erasability in their background area, and sharp and high-contrast images are formed on them.

However, the photosensitive thermal recording materials (h) and (i) of Comparative Examples, not containing the organic dye specifically defined in the invention, have low sensitivity and their color erasability in the background area is poor.

As described in detail hereinabove with reference to the preferred embodiments, the present invention provides a photopolymerizable composition highly sensitive not only to UV rays but also to rays in the visible to IR range. The invention also provides a recording material which is highly sensitive not only to UV rays but also to rays in the visible to IR range and which can be processed in a completely dry system which does not require developer and does not produce waste to form an image thereon. The non-image area (background area) of the processed material is well decolored, and a sharp and high-contrast, black-and-white or color image can be recorded on the material.

What is claimed is:

1. A photopolymerizable composition comprising:
   a polymerizable compound having an ethylenic unsaturated bond,
   a compound of the following general formula (2), and
   a radical generator that interacts with the compound of formula (2) to generate a radical:

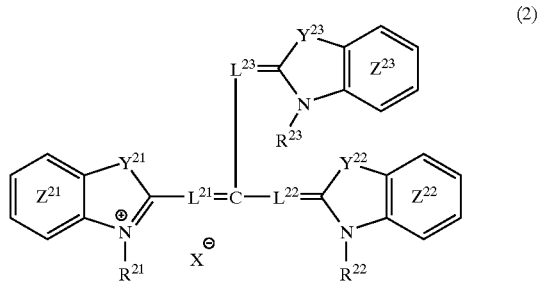

(2)

wherein $R^{21}$, $R^{22}$ and $R^{23}$ each independently represents an aliphatic group or an aromatic group; $L^{21}$, $L^{22}$, and $L^{23}$ each independently represents an unsubstituted methine group; $Y^{21}$, $Y^{22}$ and $Y^{23}$ each independently represents —$CR^{25}R^{26}$—, —$NR^{27}$—, —O—, —S—, —Se— or —Te—; $R^{25}$, $R^{26}$ and $R^{27}$ each independently represents a hydrogen atom, an aliphatic group or an aromatic group; $R^{25}$ and $R^{26}$ may be atomic groups bonded to each other to form a ring; the benzene rings $Z^{21}$, $Z^{22}$ and $Z^{23}$ may be condensed with other benzene rings; the benzene rings $Z^{21}$, $Z^{22}$ and $Z^{23}$ as well as the other benzene rings, if any, which are condensed with the benzene rings $Z^{21}$, $Z^{22}$ and $Z^{23}$ may be substituted or unsubstituted; and $X^-$ represents an anion.

2. The photopolymerizable composition as claimed in claim 1, in which the radical generator is an organoboron compound.

3. The photopolymerizable composition as claimed in claim 2 in which the organoboron compound is represented by the following general formula (A):

(A)

wherein $R_a^1$, $R_a^2$, $R_a^3$, and $R_a^4$, each independently represents an aliphatic group, an aromatic group, a heterocyclic group, or $Si(R_a^5)(R_a^6)$—$R_a^7$; $R_a^5$, $R_a^6$ and $R_a^7$ each independently represents an aliphatic group or an aromatic group; and $G^+$ represents a group which forms a cation.

4. A recording material having a recording layer on a support;
   wherein the recording layer contains at least a color-forming component A, a color-forming component B having a site that reacts with the color-forming component A to form a color, and a photopolymerizable composition;
   and the photopolymerizable composition comprises a polymerizable compound having an ethylenic unsaturated bond, a compound of the following general formula (2), and a radical generator that interacts with the compound of formula (2) to generate a radical:

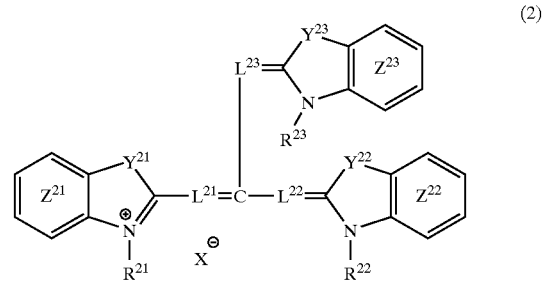

(2)

wherein $R^{21}$, $R^{22}$ and $R^{23}$ each independently represents an aliphatic group or an aromatic group; $L^{21}$, $L^{22}$ and $L^{23}$ each independently represents an unsubstituted methine group; $Y^{21}$, $Y^{22}$ and $Y^{23}$ each independently represents —$CR^{25}R^{26}$—, —$NR^{27}$—, —O—, —Se— or —Te—; $R^{25}$, $R^{26}$ and $R^{27}$ each independently represents a hydrogen atom, an aliphatic group or an aromatic group; $R^{25}$ and $R^{26}$ may be atomic groups bonded to each other to form a ring; the benzene rings $Z^{21}$, $Z^{22}$ and $Z^{23}$ may be condensed with other benzene rings; the benzene rings $Z^{21}$, $Z^{22}$ and $Z^{23}$ as well as the other benzene rings, if any, which are condensed with the benzene rings $Z^{21}$, $Z^{22}$ and $Z^{23}$ may be substituted or unsubstituted; and $X^-$ represents an anion.

5. The recording material as claimed in claim 4, in which at least one polymerizable compound having an ethylenic unsaturated bond is the color-forming component B.

6. The recording material as claimed in claim 4, in which the polymerizable compound having an ethylenic unsaturated bond is a color formation-inhibiting compound further including, in the molecule, a site that inhibits the reaction of the color-forming components A and B.

7. The recording material as claimed in claim 4, in which the color-forming component A is in microcapsules.

8. The recording material as claimed in claim 4, which has a multi-layered structure that comprises a first recording layer sensitive to light having a center wavelength of $\lambda_1$ and which forms a color, a second recording layer sensitive to light having a center wavelength of $\lambda_2$ and which forms a color that differs from the color formed by the first recording layer, . . . an i'th recording layer sensitive to light having a center wavelength of $\lambda_i$ and which forms a color that differs from the colors formed by the first, second, . . . (i-1)th recording layers, in that order.

9. A photopolymerizable composition comprising a polymerizable compound having an ethylenic unsaturated bond, a compound of the following general formula (4), and a radical generator that interacts with the compound of formula (4) to generate a radical:

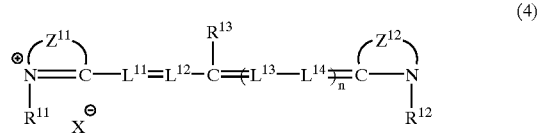

(4)

wherein $R^{11}$ and $R^{12}$ each independently represents an aliphatic group or an aromatic group; $R^{13}$ represents a group of the following formula:

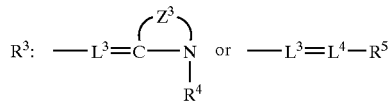

$R^4$ represents an aliphatic group or an aromatic group; $R^5$ represents a hydrogen atom, an aliphatic group, an aromatic group, or a heterocyclic group; $L^{11}$, $L^{12}$, $L^{13}$, $L^{14}$, $L^3$ and $L^4$ each independently represents a substituted or unsubstituted methine group, and in the case where $L^{11}$, $L^{12}$, $L^{13}$, $L^{14}$, $L^3$ and $L^4$ each represents a substituted methine group, the substituents may be bonded to each other to form an unsaturated aliphatic ring or an unsaturated hetero ring; $Z^{11}$, $Z^{12}$ and $Z^3$ each independently represents an atomic group which forms a 5-membered nitrogen-containing hetero ring, the nitrogen-containing hetero ring may be condensed with any of an aromatic ring or a hetero ring, and the nitrogen-containing hetero ring as well as the aromatic ring and the hetero ring, if condensed with the nitrogen-containing hetero ring, may be substituted or unsubstituted; n indicates 0, 1 or 2; and $X^-$ represents a group which forms an anion.

10. The photopolymerizable composition as claimed in claim 9, in which the compound of formula (4) is selected from any of compounds of the following general formula (5) and compounds of the following general formula (6):

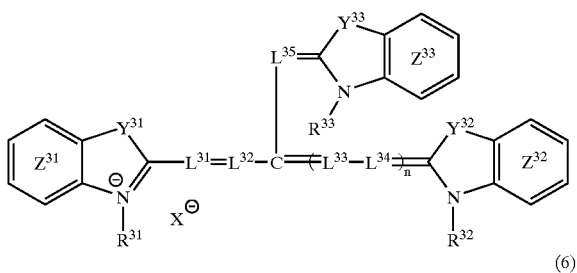

(5)

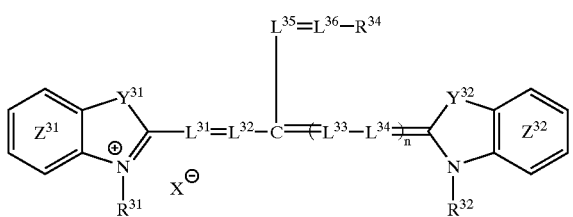

(6)

wherein $R^{31}$, $R^{32}$ and $R^{33}$ each independently represents an aliphatic group or an aromatic group; $R^{34}$ represents a hydrogen atom, an aliphatic group, an aromatic group or a heterocyclic group; $L^{31}$, $L^{32}$, $L^{33}$, $L^{34}$, $L^{35}$ and $L^{36}$ each independently represents a substituted or unsubstituted methine group; $Y^{31}$, $Y^{32}$ and $Y^{33}$ each independently represents —$CR^{35}R^{36}$—, —$NR^{37}$—, —O—, —S—, —Se— or —Te—; $R^{35}$, $R^{36}$ and $R^{37}$ each independently represents a hydrogen atom, an aliphatic group or an aromatic group; $R^{35}$ and $R^{36}$ may be atomic groups bonded to each other to form a ring; the benzene rings $Z^{31}$, $Z^{32}$ and $Z^{33}$ may be condensed with other benzene rings; the benzene rings $Z^{31}$, $Z^{32}$ and $Z^{33}$ as well as the other benzene rings, if any, which are condensed with the benzene rings $Z^{31}$, $Z^{32}$ and $Z^{33}$ may be substituted or unsubstituted; and $X^-$ represents an anion.

11. The photopolymerizable composition as claimed in claim 10, in which the radical generator is an organoboron compound.

12. The photopolymerizable composition as claimed in claim 9, in which the radical generator is an organoboron compound.

13. A recording material having a recording layer on a support;

wherein the recording layer contains at least a color-forming component A, a color-forming component B having a site that reacts with the color-forming component A to form a color, and a photopolymerizable composition;

and the photopolymerizable composition comprises a polymerizable compound having an ethylenic unsaturated bond, a compound of the following general formula (4), and a radical generator that interacts with the compound of formula (4) to generate a radical:

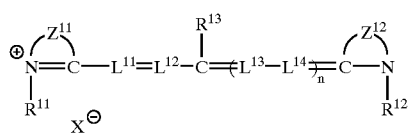 (4)

wherein $R^{11}$ and $R^{12}$ each independently represents an aliphatic group or an aromatic group; $R^{13}$ represents a group of the following formula:

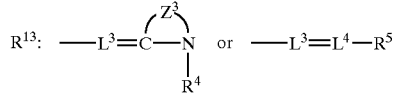

$R^4$ represents an aliphatic group or an aromatic group; $R^5$ represents a hydrogen atom, an aliphatic group, an aromatic group, or a heterocyclic group; $L^{11}$, $L^{12}$, $L^{13}$, $L^{14}$, $L^3$ and $L^4$ each independently represents a substituted or unsubstituted methine group, and in the case where $L^{11}$, $L^{12}$, $L^{13}$, $L^{14}$, $L^3$ and $L^4$ each represents a substituted methine, the substituents may be bonded to each other to form an unsaturated aliphatic ring or an unsaturated hetero ring; $Z^{11}$, $Z^{12}$ and $Z^3$ each independently represents an atomic group which forms a 5-membered nitrogen-containing hetero ring, the nitrogen-containing hetero ring may be condensed with any of an aromatic ring or a hetero ring, and the nitrogen-containing hetero ring as well as the aromatic ring and the hetero ring, if condensed with the nitrogen-containing hetero ring, may be substituted or unsubstituted; n indicates 0, 1 or 2; and $X^-$ represents a group which forms an anion.

14. The recording material as claimed in claim 13, in which at least one polymerizable compound having an ethylenic unsaturated bond is the color-forming component B.

15. The recording material as claimed in claim 13, in which the polymerizable compound having an ethylenic unsaturated bond is a color formation-inhibiting compound further including, in the molecule, a site that inhibits the reaction of the color-forming components A and B.

16. The recording material as claimed in claim 13, in which the color-forming component A is in microcapsules.

17. The recording material as claimed in claim 13, which has a multi-layered structure that comprises a first recording layer sensitive to light having a center wavelength of $\lambda_1$ and which forms a color, a second recording layer sensitive to light having a center wavelength of $\lambda_2$ and which forms a color that differs from the color formed by the first recording layer, . . . an i'th recording layer sensitive to light having a center wavelength of $\lambda_i$, and which forms a color that differs from the colors formed by the first, second, . . . (i-1)th recording layers, in that order.

* * * * *